US009577219B2

(12) United States Patent
Yamazaki et al.

(10) Patent No.: US 9,577,219 B2
(45) Date of Patent: Feb. 21, 2017

(54) LIGHT-EMITTING MODULE, LIGHT-EMITTING DEVICE, METHOD OF MANUFACTURING THE LIGHT-EMITTING MODULE, AND METHOD OF MANUFACTURING THE LIGHT-EMITTING DEVICE

(71) Applicant: Semiconductor Energy Laboratory Co., Ltd., Kanagawa-ken (JP)

(72) Inventors: Shunpei Yamazaki, Tokyo (JP); Kaoru Hatano, Kanagawa (JP); Satoshi Seo, Kanagawa (JP); Akihiro Chida, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 40 days.

(21) Appl. No.: 14/456,174

(22) Filed: Aug. 11, 2014

(65) Prior Publication Data

US 2014/0346491 A1 Nov. 27, 2014

Related U.S. Application Data

(63) Continuation of application No. 13/592,722, filed on Aug. 23, 2012, now Pat. No. 8,803,136.

(30) Foreign Application Priority Data

Aug. 26, 2011 (JP) .................................. 2011-184869

(51) Int. Cl.
*H01L 35/24* (2006.01)
*H01L 51/52* (2006.01)

(52) U.S. Cl.
CPC ... *H01L 51/5259* (2013.01); *H01L 2251/5369* (2013.01)

(58) Field of Classification Search
None
See application file for complete search history.

(56) References Cited

U.S. PATENT DOCUMENTS 4,357,557 A 11/1982 Inohara et al.
5,517,344 A * 5/1996 Hu .................. G02F 1/1339
349/149

(Continued)

FOREIGN PATENT DOCUMENTS

EP 2 009 715 A2 12/2008
EP 2 182 565 A1 5/2010
(Continued)

OTHER PUBLICATIONS

Park, J.-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

*Primary Examiner* — Robert Bachner
(74) *Attorney, Agent, or Firm* — Husch Blackwell LLP

(57) ABSTRACT

A highly reliable light-emitting module including an organic EL element or a light-emitting device using a highly reliable light-emitting module including an organic EL element is provided. Alternatively, a method of manufacturing a highly reliable light-emitting module including an organic EL element, or a method of manufacturing a light-emitting device using a highly reliable light-emitting module including an organic EL element is provided. The light-emitting module has a structure in which a light-emitting element formed over a first substrate and a viscous material layer are sealed in a space between the first substrate and a second substrate which face each other, with a sealing material surrounding the light-emitting element. The viscous material layer is provided between the light-emitting element and the (Continued)

second substrate and includes a non-solid material and a drying agent which reacts with or adsorbs an impurity.

18 Claims, 10 Drawing Sheets

(56) References Cited

U.S. PATENT DOCUMENTS

| | | | |
|---|---|---|---|
| 5,632,663 A | 5/1997 | Ishihara et al. | |
| 5,962,962 A | 10/1999 | Fujita et al. | |
| 6,605,826 B2 | 8/2003 | Yamazaki et al. | |
| 6,980,275 B1 | 12/2005 | Konuma et al. | |
| 8,247,813 B2 | 8/2012 | Koyama et al. | |
| 8,258,696 B2 | 9/2012 | Oh et al. | |
| 8,330,339 B2 | 12/2012 | Oh et al. | |
| 8,357,929 B2 | 1/2013 | Ryu et al. | |
| 8,721,381 B2 | 5/2014 | Oh et al. | |
| 8,784,150 B2 | 7/2014 | Oh et al. | |
| 8,866,138 B2 | 10/2014 | Koyama et al. | |
| 2001/0020922 A1 | 9/2001 | Yamazaki et al. | |
| 2003/0201448 A1* | 10/2003 | Yamazaki et al. | 257/79 |
| 2004/0113873 A1 | 6/2004 | Shirasaki et al. | |
| 2005/0140265 A1 | 6/2005 | Hirakata | |
| 2005/0170438 A1* | 8/2005 | Chan-Hui et al. | 435/7.2 |
| 2005/0263775 A1 | 12/2005 | Ikeda et al. | |
| 2009/0009046 A1 | 1/2009 | Oh et al. | |
| 2010/0244057 A1 | 9/2010 | Ryu et al. | |
| 2013/0009194 A1 | 1/2013 | Yamazaki et al. | |
| 2015/0021600 A1 | 1/2015 | Koyama et al. | |

FOREIGN PATENT DOCUMENTS

| | | |
|---|---|---|
| EP | 2 197 240 A1 | 6/2010 |
| EP | 2 234 187 A1 | 9/2010 |
| JP | 58-079218 A | 5/1983 |
| JP | 05-041281 A | 2/1993 |
| JP | 2000-260562 A | 9/2000 |
| JP | 2001-066612 A | 3/2001 |
| JP | 2001-217071 A | 8/2001 |
| JP | 2002-008853 A | 1/2002 |
| JP | 2002-025769 A | 1/2002 |
| JP | 2002-324673 A | 11/2002 |
| JP | 2005-209633 A | 8/2005 |
| JP | 2006-179218 A | 7/2006 |
| JP | 2009-009923 A | 1/2009 |
| JP | 2010-108905 A | 5/2010 |
| JP | 2010-225569 A | 10/2010 |
| JP | 2011-139056 A | 7/2011 |
| JP | 2011-204645 A | 10/2011 |
| WO | WO 2011/068017 A1 | 6/2011 |

* cited by examiner

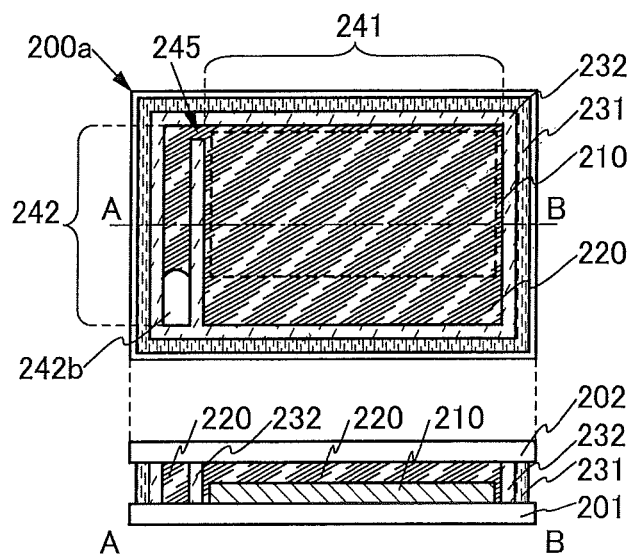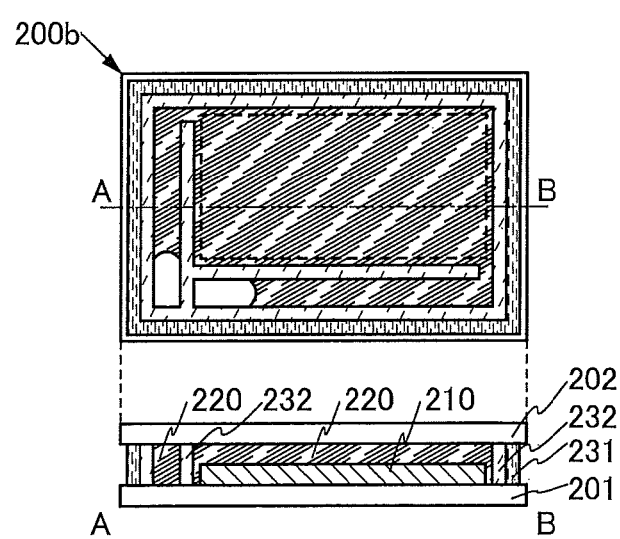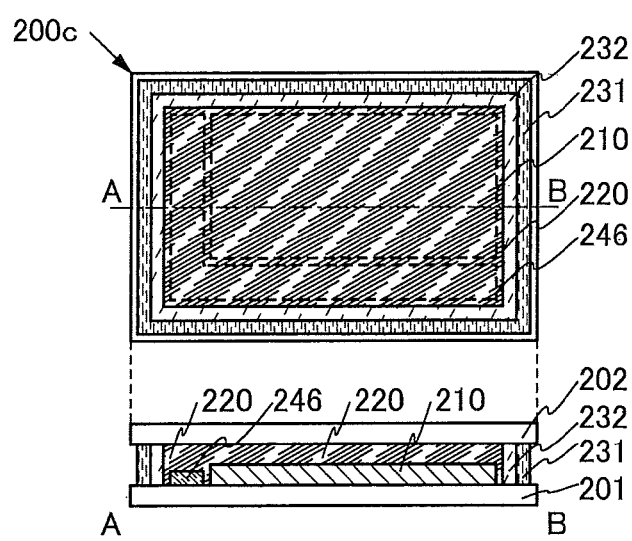

LIGHT-EMITTING MODULE, LIGHT-EMITTING DEVICE, METHOD OF MANUFACTURING THE LIGHT-EMITTING MODULE, AND METHOD OF MANUFACTURING THE LIGHT-EMITTING DEVICE

This application is a continuation of copending U.S. application Ser. No. 13/592,722, filed on Aug. 23, 2012 which is incorporated herein by reference.

BACKGROUND OF THE INVENTION

1. Field of the Invention

The present invention relates to a light-emitting module, a light-emitting device using the light-emitting module, a method of manufacturing the light-emitting module, and a method of manufacturing the light-emitting device using the light-emitting module.

2. Description of the Related Art

A light-emitting element, in which a layer including an organic compound having a light-emitting property (also referred to as EL layer) which is formed in a film shape is provided between a pair of electrodes, is known. Such a light-emitting element is called, for example, an organic EL element. Light emission can be obtained from the layer including an organic compound having a light-emitting property when a voltage is applied between the pair of electrodes. Lighting devices and light-emitting devices used for display devices and the like each using organic EL elements are known. An example of a display device using an organic EL element is disclosed in Patent Document 1.

The reliability of an organic EL element tends to decrease in the environment where there are impurities in the air (such as water and/or oxygen). A variety of structures for sealing an organic EL element have been considered.

For example, a sealing structure in which an organic EL element formed over a substrate with low moisture permeability is covered with a sealing film with low moisture permeability is known. Further, Patent Document 2 discloses an example of a display device in which a pair of substrates is firmly bonded so that a layer containing a hygroscopic substance and an organic EL element can be sealed in a space between the pair of substrates.

REFERENCES

Patent Document 1: Japanese Published Patent Application No. 2002-324673
Patent Document 2: Japanese Published Patent Application No. 2005-209633

SUMMARY OF THE INVENTION

A sealing film covering an organic EL element needs to be sufficiently thick using a material which does not easily allow entry of impurities from the air to have sufficiently low moisture permeability (specifically, to have such a gas barrier property that the water vapor transmittance is $10^{-5}$ g/m²·day or less, preferably $10^{-6}$ g/m²·day or less).

For example, a film containing an inorganic material which is formed to be sufficiently thick by a CVD method, a sputtering method, or the like without causing a pinhole does not easily allow entry of impurities from the air and is suitable as the sealing film for an organic EL element. However, with a CVD method, a sputtering method, or the like, a sealing film having a sufficient thickness is difficult to form in a short time due to low film deposition speed.

In contrast, with a method in which a liquid composition is hardened, a thick film can be formed in a short time. However, hardening a liquid composition in contact with an organic EL element involves a volume shrinkage, which applies a stress to the organic EL element. Consequently the organic EL element may be damaged to cause a defect in light emission.

One embodiment of the present invention is made in view of the foregoing technical background. It is an object of one embodiment of the present invention to provide a highly reliable light-emitting module including an organic EL element.

In addition, it is an object to provide a light-emitting device using a highly reliable light-emitting module including an organic EL element.

In addition, it is an object to provide a method of manufacturing a highly reliable light-emitting module including an organic EL element.

In addition, it is an object to provide a method of manufacturing a light-emitting device using a highly reliable light-emitting module including an organic EL element.

In order to achieve the above objects, one embodiment of the present invention has focused on the stress applied to an organic EL element by the sealing structure in which the organic EL element is covered. Further, one embodiment of the present invention has arrived at an idea of a light-emitting module having a structure described below, which solves the above problems.

A light-emitting module of one embodiment of the present invention has a structure in which a light-emitting element formed over a first substrate and a viscous material layer are sealed in a space between the first substrate and a second substrate which face each other, with a sealing material surrounding the light-emitting element. The viscous material layer is provided between the light-emitting element and the second substrate, and includes a non-solid material having viscosity and a drying agent that can react with or adsorb an impurity.

That is, one embodiment of the present invention is a light-emitting module including a first substrate, a second substrate facing the first substrate, a sealing material bonding the first and second substrates, and a light-emitting element, a viscous material layer, and a frame which are between the first substrate and the second substrate. In the light-emitting module, the light-emitting element includes a first electrode provided over the first substrate, a second electrode overlapping with the first electrode, and a layer including an organic compound having a light-emitting property between the first and second electrodes. In addition, the viscous material layer is in contact with the light-emitting element and provided between the first and second substrates, and includes a non-solid material having viscosity and a drying agent that can react with or adsorb an impurity. Further, the frame surrounds the light-emitting element and the viscous material layer. In addition, the sealing material is provided so that the light-emitting element, the viscous material layer, and the frame can be sealed inside.

The light-emitting module of one embodiment of the present invention has a structure in which the light-emitting element formed over the first substrate and the viscous material layer are sealed in a space between the first and second substrates which face each other, with the sealing material surrounding the light-emitting element. The viscous material layer is surrounded by the frame, in contact with the light-emitting element and provided between the first and second substrates, and includes a non-solid material having viscosity and a drying agent that reacts with an impurity (typically water and/or oxygen) or adsorbs an impurity.

Since the light-emitting element is enclosed by the first substrate, the second substrate, the sealing material bonding the first and second substrates, and the viscous material layer, entry of impurities into the light-emitting module can be reduced. Further, since the viscous material layer is non-solid, it flows between the light-emitting element and the second substrate. Accordingly, a stress applied to the light-emitting element is reduced by the viscous material layer, so that damage to the light-emitting element can be prevented. Furthermore, the drying agent included in the viscous material layer reacts with or adsorbs an impurity remaining in the light-emitting module and/or an impurity entering the light-emitting module from the outside of the module. Accordingly, deterioration of the light-emitting element can be prevented. Further, the viscous material layer provided in contact with the light-emitting element can release heat generated by driving of the light-emitting element, to the second substrate, so that deterioration of the light-emitting element caused by the heat can be reduced. Furthermore, a stress generated between the light-emitting element and the second substrate because of a change in the size of the light-emitting element due to the heat generation can be reduced by the viscous material layer between the light-emitting element and the second substrate, so that damage to the light-emitting element can be prevented.

Because of a combined effect of the above, a highly reliable light-emitting module including an organic EL element can be provided. Further, a light-emitting module which is unlikely to cause a defect in light emission can be provided.

One embodiment of the present invention is a light-emitting module including a first substrate, a second substrate facing the first substrate, a sealing material bonding the first and second substrates, and a light-emitting element, a viscous material layer, and a frame which are between the first substrate and the second substrate. In the light-emitting module, the light-emitting element includes a first electrode provided over the first substrate, a second electrode overlapping with the first electrode, and a layer including an organic compound having a light-emitting property between the first and second electrodes. In addition, the viscous material layer is in contact with the light-emitting element and provided between the first and second substrates, and includes a non-solid material having viscosity and a drying agent that can react with or adsorb an impurity. Further, the frame surrounds the light-emitting element, the viscous material layer, a first space, and a second space. The first space overlaps with the light-emitting element, while the second space is connected to the first space through a narrow portion and includes at least a portion which is not filled with the viscous material layer. In addition, the sealing material is provided so that the light-emitting element, the viscous material layer, and the frame can be sealed inside.

The light-emitting module of one embodiment of the present invention has a structure in which the light-emitting element formed over the first substrate and the viscous material layer are sealed in a space between the first and second substrates which face each other, with the sealing material surrounding the light-emitting element. The viscous material layer is surrounded by the frame, in contact with the light-emitting element and provided between the first and second substrates, and includes a non-solid material having viscosity and a drying agent that reacts with an impurity (typically water and/or oxygen) or adsorbs an impurity. In addition, the frame surrounds the first space overlapping with the light-emitting element and the second space connected to the first space through the narrow portion. At least the portion of the second space is not filled with the viscous material layer.

Since the light-emitting element is enclosed by the first substrate, the second substrate, the sealing material bonding the first and second substrates, and the viscous material layer, entry of impurities into the light-emitting module can be reduced. Further, since the viscous material layer is non-solid, it flows between the light-emitting element and the second substrate. Accordingly, a stress applied to the light-emitting element is reduced by the viscous material layer, so that damage to the light-emitting element can be prevented. Furthermore, the drying agent included in the viscous material layer reacts with or adsorbs an impurity remaining in the light-emitting module and/or an impurity entering the light-emitting module from the outside of the module. Accordingly, deterioration of the light-emitting element can be prevented. Further, the viscous material layer provided in contact with the light-emitting element can release heat generated by driving of the light-emitting element, to the second substrate, so that deterioration of the light-emitting element caused by the heat can be reduced. Furthermore, a stress generated between the light-emitting element and the second substrate because of a change in the size of the light-emitting element due to the heat generation can be reduced by the viscous material layer between the light-emitting element and the second substrate, so that damage to the light-emitting element can be prevented. In addition, the portion in the second space which is connected to the first space through the narrow portion and is not filled with the viscous material layer can compensate for a change in the volume of the viscous material layer due to heat generation in the light-emitting module or can reduce a stress due to the volume change. Accordingly, it is possible to prevent the phenomenon in which the viscous material layer expands with heat to break the sealing structure (e.g., the bond structure of the sealing material) of the light-emitting module.

Because of a combined effect of the above, a highly reliable light-emitting module including an organic EL element can be provided. Further, a light-emitting module which is unlikely to cause a defect in light emission can be provided.

One embodiment of the present invention is a light-emitting module which has the above structure and in which the second electrode, the viscous material layer, and the second substrate can transmit light emitted from the layer including an organic compound having a light-emitting property.

In the light-emitting module of one embodiment of the present invention, components from the second electrode of the light-emitting element to the second substrate are each formed using a material having a light-transmitting property. Consequently, light emitted from the light-emitting element can be extracted through the second substrate. In addition, the second electrode of the light-emitting element and the second substrate are optically connected to each other by the viscous material layer, so that light emitted from the layer including an organic compound having a light-emitting property can be efficiently extracted through the second substrate. Accordingly, a light-emitting module having high emission efficiency can be provided. Further, a highly reliable light-emitting module can be provided. Further, a light-emitting module which is unlikely to cause a defect in light emission can be provided.

One embodiment of the present invention is a light-emitting module which has the above structure and in which the median particle size of the drying agent included in the viscous material layer is greater than or equal to 10 nm and less than or equal to 400 nm.

The light-emitting module of one embodiment of the present invention includes the drying agent having a median particle size greater than or equal to 10 nm and less than or equal to 400 nm. This can inhibit the phenomenon in which light emitted by the organic compound having a light-emitting property is scattered in the viscous material layer. Accordingly, a light-emitting module having high emission efficiency can be provided. Further, a highly reliable light-emitting module can be provided. Further, a light-emitting module which is unlikely to cause a defect in light emission can be provided.

One embodiment of the present invention is a light-emitting module which has the above structure and further includes an activation material layer between the first substrate and the second substrate. The activation material layer overlaps with a region between the light-emitting element and the frame and includes a material which can activate the drying agent included in the viscous material layer.

The light-emitting module of one embodiment of the present invention includes the activation material layer between the light-emitting element and the frame. The activation material layer includes the activation material and has the effect of activating the drying agent included in the viscous material layer. In such a structure, the viscous material layer having fluidity flows in a space to be surrounded by the frame surrounding the light-emitting element. The drying agent included in the viscous material layer reacts with or adsorbs an impurity between the second electrode of the light-emitting element and the second substrate. Then, the drying agent which have reacted with or adsorbed an impurity comes in contact with the activation material layer provided between the light-emitting element and the frame, and is reactivated. Thus, a highly reliable light-emitting module including an organic EL element can be provided. Further, a light-emitting module which is unlikely to cause a defect in light emission can be provided.

One embodiment of the present invention is a light-emitting device including a first substrate, a second substrate facing the first substrate, a sealing material bonding the first and second substrates, a transistor, and a light-emitting element, a viscous material layer, and a frame which are between the first substrate and the second substrate. In the light-emitting device, the transistor is provided over the first substrate. In addition, the light-emitting element includes a first electrode which is provided over the first substrate and supplied with electric power through the transistor, a second electrode overlapping with the first electrode, and a layer including an organic compound having a light-emitting property between the first and second electrodes. In addition, the viscous material layer is in contact with the light-emitting element and provided between the first and second substrates, and includes a non-solid material having viscosity and a drying agent that can react with or adsorb an impurity. Further, the frame surrounds the transistor, the light-emitting element, and the viscous material layer. In addition, the sealing material is provided so that the light-emitting element, the viscous material layer, and the frame can be sealed inside.

The light-emitting device of one embodiment of the present invention has a structure in which the transistor formed over the first substrate, the light-emitting element which is formed over the first substrate and connected to the transistor, and the viscous material layer are sealed in a space between the first and second substrates which face each other, with the sealing material surrounding the light-emitting element. The viscous material layer is surrounded by the frame, in contact with the light-emitting element and provided between the first and second substrates, and includes a non-solid material having viscosity and a drying agent that reacts with an impurity (typically water and/or oxygen) or adsorbs an impurity.

Since the light-emitting element is enclosed by the first substrate, the second substrate, the sealing material bonding the first and second substrates, and the viscous material layer, entry of impurities into the light-emitting device can be reduced. Further, since the viscous material layer is non-solid, it flows between the light-emitting element and the second substrate. Accordingly, a stress applied to the light-emitting element is reduced by the viscous material layer, so that damage to the light-emitting element can be prevented. Furthermore, the drying agent included in the viscous material layer reacts with or adsorbs an impurity remaining in the light-emitting device and/or an impurity entering the light-emitting device from the outside of the device. Accordingly, deterioration of the light-emitting element can be prevented. Further, the viscous material layer provided in contact with the light-emitting element can release heat generated by driving of the light-emitting element, to the second substrate, so that deterioration of the light-emitting element caused by the heat can be reduced. Furthermore, a stress generated between the light-emitting element and the second substrate because of a change in the size of the light-emitting element due to the heat generation can be reduced by the viscous material layer between the light-emitting element and the second substrate, so that damage to the light-emitting element can be prevented.

Accordingly, a highly reliable light-emitting device including an organic EL element can be provided. Further, a light-emitting device which is unlikely to cause a defect in light emission can be provided.

One embodiment of the present invention is a light-emitting device which has the above structure and in which the transistor includes a gate insulating layer, a gate electrode in contact with one side of the gate insulating layer, an oxide semiconductor layer that is in contact with the other side of the gate insulating layer and overlaps with the gate electrode, and a source electrode and a drain electrode that are each electrically connected to the oxide semiconductor layer and have a gap overlapping with the gate electrode, and in which the first electrode of the light-emitting element is electrically connected to the source electrode or the drain electrode.

The light-emitting device of one embodiment of the present invention includes the transistor including the oxide semiconductor layer in a channel formation region, in which the transistor and the viscous material layer are sealed with the sealing material surrounding the light-emitting element. In addition, the viscous material layer includes the non-solid material having viscosity and the drying agent which can react with or adsorb an impurity (typically water).

Since the transistor including the oxide semiconductor layer in a channel formation region and the light-emitting element are enclosed by the first substrate, the second substrate, the sealing material bonding the first and second substrates, and the viscous material layer, entry of impurities into the light-emitting device can be reduced. Furthermore, the drying agent included in the viscous material layer reacts with or adsorbs an impurity remaining in the light-emitting device and/or an impurity entering the light-emitting device from the outside of the device. Accordingly, an impurity including a hydrogen atom (typically water) can be prevented from reducing the reliability of the transistor including the oxide semiconductor layer in a channel formation region.

Accordingly, a highly reliable light-emitting device including an organic EL element can be provided. Further, a light-emitting device which is unlikely to cause a defect in light emission can be provided.

One embodiment of the present invention is a method of manufacturing a light-emitting module including a first step of forming a light-emitting element over a first substrate, a second step of forming a frame to surround the light-emitting element and a sealing material to surround the frame over a second substrate, a third step of dripping a non-solid material having viscosity which includes a drying agent that reacts with or adsorbs an impurity into a region surrounded by the frame, and a fourth step of bonding the first substrate and the second substrate using the sealing material, whereby the light-emitting element, the non-solid material, and the frame are sealed inside.

In the above method of manufacturing a light-emitting module of one embodiment of the present invention, subsequent to the step of dripping a non-solid material having viscosity which includes a drying agent that reacts with or adsorbs an impurity into a region surrounded by the frame, the first substrate and the second substrate are bonded with the sealing material so that the light-emitting element, the frame, and the non-solid material can be sealed inside.

Accordingly, the viscous material layer including the non-solid material can be efficiently formed between the first substrate and the second substrate which are large substrates.

Accordingly, a highly reliable light-emitting module including an organic EL element can be manufactured. Further, a light-emitting module which is unlikely to cause a defect in light emission can be manufactured.

One embodiment of the present invention is a method of manufacturing a light-emitting device including a first step of forming a transistor and a light-emitting element over a first substrate, a second step of forming a frame to surround the transistor and the light-emitting element and a sealing material to surround the frame over a second substrate, a third step of dripping a non-solid material having viscosity which includes a drying agent that reacts with or adsorbs an impurity into a region surrounded by the frame, and a fourth step of bonding the first substrate and the second substrate using the sealing material, whereby the transistor, the light-emitting element, the non-solid material, and the frame are sealed inside.

In the above method of manufacturing a light-emitting device of one embodiment of the present invention, subsequent to the step of dripping a non-solid material having viscosity which includes a drying agent that reacts with or adsorbs an impurity into a region surrounded by the frame, the first substrate and the second substrate are bonded with the sealing material so that the transistor, the light-emitting element, the frame, and the non-solid material can be sealed inside.

Accordingly, the viscous material layer including the non-solid material can be efficiently formed between the first substrate and the second substrate which are large substrates.

Thus, a highly reliable light-emitting device including an organic EL element can be manufactured. Further, a light-emitting device which is unlikely to cause a defect in light emission can be manufactured.

Note that in this specification, an "EL layer" refers to a layer provided between a pair of electrodes in a light-emitting element. Thus, a light-emitting layer including an organic compound that is a light-emitting substance which is interposed between electrodes is one mode of the EL layer.

In this specification, in the case where a substance A is dispersed in a matrix formed using a substance B, the substance B forming the matrix is referred to as host material while the substance A dispersed in the matrix is referred to as guest material. Note that the substance A and the substance B may each be a single substance or a mixture of two or more kinds of substances.

Note that a light-emitting device in this specification means an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

In accordance with one embodiment of the present invention, a highly reliable light-emitting module including an organic EL element can be provided.

Further, a light-emitting device using a highly reliable light-emitting module including an organic EL element can be provided.

Alternatively, a method of manufacturing a highly reliable light-emitting module including an organic EL element can be provided.

Alternatively, a method of manufacturing a light-emitting device using a highly reliable light-emitting module including an organic EL element can be provided.

BRIEF DESCRIPTION OF THE DRAWINGS

In the accompanying drawings:

FIGS. 2A to 2C illustrate structures of a light-emitting module according to one embodiment of the present invention;

DETAILED DESCRIPTION OF THE INVENTION

Figure 1A:
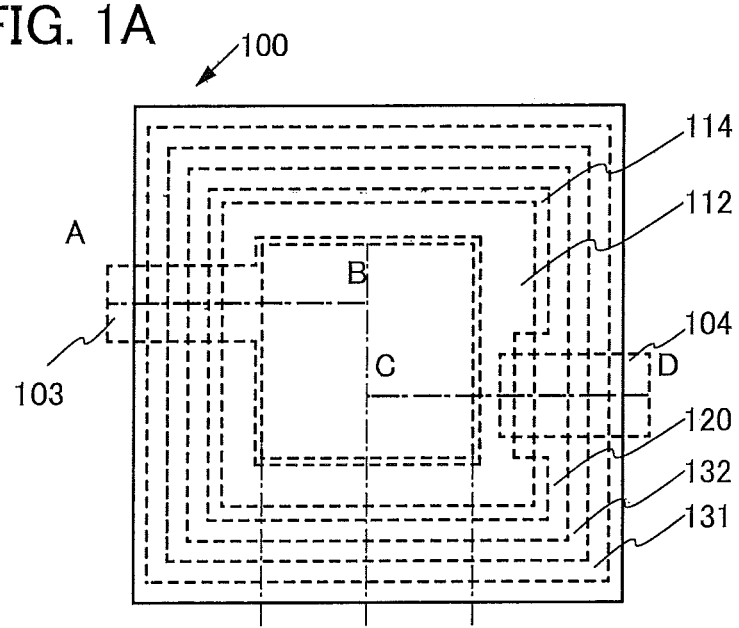
FIGS. 1A and 1B illustrate a structure of a light-emitting module according to one embodiment of the present invention.

Embodiments will be described in detail with reference to the drawings. Note that the present invention is not limited to the following description. It will be easily understood by those skilled in the art that modes and details thereof can be variously changed without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a light-emitting module of one embodiment of the present invention is described with reference to FIGS. 1A and 1B.

Figure 1B:
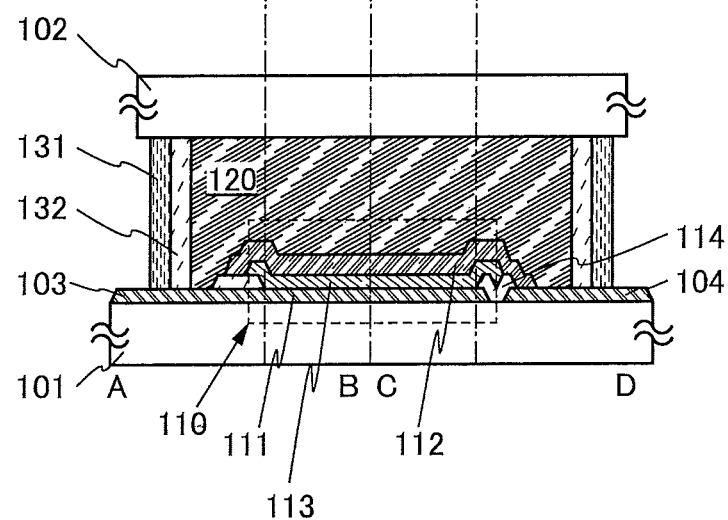

A structure of the light-emitting module of one embodiment of the present invention is illustrated in FIGS. 1A and 1B. FIG. 1A is a top view of the light-emitting module of one embodiment of the present invention, and FIG. 1B is a cross-sectional view along the lines A-B and C-D in FIG. 1A.

A light-emitting module 100 exemplified in FIGS. 1A and 1B has a structure in which a light-emitting element 110 and a viscous material layer 120 are sealed between a first substrate 101 and a second substrate 102 with a sealing material 131 surrounding the light-emitting element 110. The light-emitting element 110 includes a first electrode 111, a second electrode 112, and therebetween, a layer 113 including an organic compound having a light-emitting property. In addition, a partition 114 has an opening overlapping with the first electrode 111. The first electrode 111 is electrically connected to a first terminal 103. The second electrode 112 is electrically connected to a second terminal 104. The viscous material layer 120 is surrounded by a frame 132 and provided in contact with the second electrode 112 between the first substrate 101 and the second substrate 102.

Note that a sealing film covering the light-emitting element 110 may be provided between the light-emitting element 110 and the viscous material layer.

Viscous Material Layer

The viscous material layer 120 includes a drying agent and a non-solid material having viscosity.

In addition, the viscous material layer 120 has fluidity. Preferably, the viscous material layer 120 includes a viscous material whose viscosity is typically greater than or equal to 1 cp and less than or equal to 500 cp. When the viscosity of the viscous material is greater than or equal to 1 cp, the viscous material does not easily drop and consequently it is possible to prevent, for example, a drop from an application device for the viscous material, which facilitates manufacture of the viscous material layer 120. When the viscosity of the viscous material is less than or equal to 500 cp, the stress applied by the viscous material layer 120 to the second electrode 112 of the light-emitting element 110 can be reduced. Accordingly, the drying agent can be provided close to the light-emitting element 110 without damaging the light-emitting element 110, so that dispersion of impurities into the light-emitting element 110 can be effectively reduced. Thus, the reliability of the light-emitting element 110 can be effectively improved.

Preferably, the drying agent includes a material which reacts with or adsorbs an impurity, typically a material which reacts with or adsorbs water and/or oxygen or a material which adsorbs water and/or oxygen. Note that the term impurity means a substance which reduces the reliability of the light-emitting element, typically water, oxygen, or the like. Water, oxygen, or the like causes deterioration of the layer including an organic compound having a light-emitting property, impairing light-emitting characteristics of the light-emitting element. Examples of the material applicable to the drying agent are chemically adsorbing type drying agents such as oxides of alkali metals and oxides of alkaline earth metals, physically adsorbing type drying agents such as a zeolite, silica gel, aluminum oxide, and allophone, and the like. Note that when the drying agent which had reacted with an impurity generates gas or significantly changes in volume in the sealed space, a stress is applied to the sealing structure (e.g., the sealing material), which may break the sealing structure. Physically adsorbing type drying agents are preferably used, in which case reaction with or adsorption of an impurity causes insignificant gas generation or a slight increase in volume.

The non-solid material having viscosity can also be referred to as viscous non-solid material and has fluidity while containing the drying agent. A material which does not dissolve the layer including an organic compound having a light-emitting property or a material having low volatility is preferred. Examples of the material applicable to the non-solid material having viscosity are straight silicone fluids, modified silicone fluids, liquid paraffins, perfluorocarbons, and the like. Note that specific examples of straight silicone fluids are dimethyl silicone fluids, methyiphenyl silicone fluids, methyl hydrogen silicone fluids, and the like. Further, specific examples of modified silicone fluids are silicone fluid in which an organic group is introduced into a side chain, one or both ends of the main chain, or both a side chain and the main chain of polysiloxane, such as polyether-modified silicone fluids, methylstyryl-modified silicone fluids, alkyl-modified silicone fluids, fluids modified with higher fatty acid ester, fluids containing higher fatty acids, and fluorine-modified silicone fluids.

In the light-emitting module 100 described in this embodiment, the viscous material layer 120 includes a zeolite as the drying agent and a silicone fluid as the non-solid material having viscosity.

Frame

The frame 132 is in contact with the viscous material layer 120 while surrounding the viscous material layer 120 provided between the first substrate 101 and the second substrate 102. The frame 132 may have a single-layer structure or a layered structure including two or more layers or may doubly surround the viscous material layer 120. Note that the distance between the first substrate 101 and the second substrate 102 may be adjusted with use of the height of the frame 132 from either substrate.

The frame 132 is a material which does not react with the viscous material layer 120, preferably a material which does not easily allow entry of impurities. Examples of the material applicable to the frame 132 are a photoresist, an acrylic resin, a polyimide, and the like.

In the light-emitting module 100 described in this embodiment, a polyimide is used for the frame 132.

Sealing Material

The sealing material 131 bonds the first substrate 101 and the second substrate 102, and seals, between the first substrate 101 and the second substrate 102, the light-emitting element 110 and the viscous material layer 120 surrounded by the frame 132. The sealing material 131 may have a single-layer structure or a layered structure including two or more layers or may doubly surround the frame 132.

The sealing material 131 is a material which can bond the first substrate 101 and the second substrate 102, preferably a material which does not easily allow entry of impurities. Examples of the material applicable to the sealing material 131 are epoxy resins, silicone resins, glass frit, glass ribbon, solder, and the like.

Note that when not a material which reacts with the viscous material layer 120, the sealing material 131 can also serve as the frame 132. The sealing material 131 which also serves as the frame 132 is preferred in that the kinds of materials used or manufacturing steps can be reduced.

In the light-emitting module 100 described in this embodiment, an ultraviolet curable epoxy resin is used for the sealing material 131.

First Substrate and Second Substrate

The first substrate 101 and the second substrate 102 each have heat resistance high enough to resist the manufacturing process and are not particularly limited in thickness and size as long as they can be applied to a manufacturing apparatus. In addition, the first substrate 101 and the second substrate 102 may have a single-layer structure or a layered structure including two or more layers.

The first substrate 101 and the second substrate 102 preferably have a gas barrier property. A film having a gas barrier property may be formed between either substrate and the light-emitting element. Specifically, the first substrate 102 and the second substrate 102 preferably have such a gas barrier property that the water vapor permeability is less than or equal to $10^{-5}$ g/m$^2$·day, preferably less than or equal to $10^{-6}$ g/m$^2$·day, in which case the reliability of the light-emitting module can be improved.

The first substrate 101 and the second substrate 102 may have flexibility. As a substrate having flexibility, other than a plastic substrate, thin glass having a thickness greater than or equal to 50 μm and less than or equal to 500 μm, or metal foil can be used.

Note that at least one of the first substrate 101 and the second substrate 102 transmits light emitted from the light-emitting element.

Examples of a substrate which transmits visible light emitted from the light-emitting element are no-alkali glass substrates, barium borosilicate glass substrate, aluminoborosilicate glass substrates, quartz substrates, sapphire substrates, substrates including fiberglass-reinforced plastics (FRP), polyester, acrylic, or polyimide, and the like.

For either the first substrate 101 or the second substrate 102, a substrate which has difficulty in transmitting light emitted from the light-emitting element formed over the first substrate may be used. For example, any of ceramic substrates and metal substrates containing stainless steel can be used.

A surface of the first substrate 101 over which the light-emitting element is formed preferably has an insulating property. Further, an insulating film may be stacked. The surface of the first substrate 101 over which the light-emitting element is formed is preferably flat. In addition, a film for planarization may be formed between the first substrate 101 the light-emitting element.

In the light-emitting module 100 described in this embodiment, a non-alkali glass substrate is used for each of the first substrate 101 and the second substrate 102.

Light-Emitting Element

In the light-emitting element 110, the layer 113 including an organic compound having a light-emitting property is provided between the first electrode 111 and the second electrode 112. Further, at least one of the electrodes over a substrate which transmits light emitted from the light-emitting element (specifically, the first electrode 111 or the second electrode 112) transmits light emitted from the layer 113 including an organic compound having a light-emitting property. Note that the detailed structure of the light-emitting element applicable to the light-emitting module exemplified in this embodiment is described not here but in Embodiment 6.

The light-emitting module 100 described in this embodiment includes the light-emitting element 110 including a layer which emits white light as the layer 113 including an organic compound having a light-emitting property.

Partition

The partition 114 is a layer that electrically insulates the first electrode 111 and the second electrode 112. The partition 114 may have a single-layer structure or a layered structure including two or more layers and is not particularly limited in thickness. In addition, the partition 114 is preferably formed to have a curved surface with curvature at an upper end portion or a lower end portion.

A material that can be used for the partition 114 is preferably a material which has an insulating property and has heat resistance high enough to resist the manufacturing process. For example, it is possible to use an insulating layer formed of a material selected from a photopolymer, (specifically, photosensitive acrylic, photosensitive polyimide, and the like), an inorganic material film, an organic material film, or an insulating layer including a material selected from the above materials.

In the light-emitting module 100 described in this embodiment, the partition 114 is formed using positive photosensitive polyimide and has a curved surface having a radius of curvature greater than or equal to 0.2 μm and less than or equal to 3 μm at an upper end portion.

The light-emitting module of one embodiment of the present invention has a structure in which the light-emitting element formed over the first substrate and the viscous material layer are sealed in a space between the first and second substrates which face each other, with the sealing material surrounding the light-emitting element. The viscous material layer is surrounded by the frame, in contact with the light-emitting element and provided between the first and second substrates, and includes a non-solid material having viscosity and a drying agent that reacts with an impurity (typically water and/or oxygen) or adsorbs an impurity.

Since the light-emitting element is enclosed by the first substrate, the second substrate, the sealing material bonding the first and second substrates, and the viscous material layer, entry of impurities into the light-emitting module can be reduced. Further, since the viscous material layer is non-solid, it flows between the light-emitting element and the second substrate. Accordingly, a stress applied to the light-emitting element is reduced by the viscous material layer, so that damage to the light-emitting element can be prevented. Furthermore, the drying agent included in the viscous material layer reacts with or adsorbs an impurity remaining in the light-emitting module and/or an impurity entering the light-emitting module from the outside of the module. Accordingly, deterioration of the light-emitting element can be prevented. Further, the viscous material layer provided in contact with the light-emitting element can release heat generated by driving of the light-emitting element, to the second substrate, so that deterioration of the light-emitting element caused by the heat can be reduced. Furthermore, a stress generated between the light-emitting element and the second substrate because of a change in the size of the light-emitting element due to the heat generation can be reduced by the viscous material layer between the light-emitting element and the second substrate, so that damage to the light-emitting element can be prevented.

Because of a combined effect of the above, a highly reliable light-emitting module including an organic EL element can be provided. Further, a light-emitting module which is unlikely to cause a defect in light emission can be provided.

Modification Example 1

A modification example of the light-emitting module exemplified in this embodiment is described with reference to FIG. 2A. The upper part of FIG. 2A is a top view of the light-emitting module of one embodiment of the present invention and the lower part is a cross-sectional view along the cutting plane line A-B. A light-emitting module 200a of one embodiment of the present invention has a structure in which a light-emitting element 210 formed over a first substrate 201 and a viscous material layer 220 are sealed in a space between the first substrate 201 and a second substrate 202 which face each other, with a sealing material 231 surrounding the light-emitting element 210. The viscous material layer 220 is surrounded by a frame 232 and provided in contact with the second electrode of the light-emitting element 210 and (the electrode on the side opposite to the side in contact with the first substrate 201, although not illustrated) between the first substrate 201 and the second substrate 202, and includes a non-solid material having viscosity and a drying agent that reacts with an impurity (typically water and/or oxygen) or adsorbs an impurity. In addition, the frame 232 surrounds a first space 241 overlapping with the light-emitting element 210 and a second space 242 connected to the first space 241 through a narrow portion 245. At least a portion 242b of the second space 242 is not filled with the viscous material layer 220.

The narrow portion allows the viscous material layer to flow between the first space and the second space. The narrow portion also prevents the portion 242b in the second space which is not filled with the viscous material layer from moving toward the first space. The shape of the second space is not limited to the shape which extends from the narrow portion. For example, the second space may have a tubular shape with a cross section having substantially the same area as the narrow portion or may have a meandering shape to have a sufficient volume.

Note that a plurality of second spaces can also be provided in the light-emitting module. The plurality of separate second spaces allows more flexibility in the layout of the light-emitting module, which can provide additional values. A light-emitting module 200b exemplified in FIG. 2B includes the two second spaces.

Since the light-emitting element is enclosed by the first substrate, the second substrate, the sealing material bonding the first and second substrates, and the viscous material layer, entry of impurities into the light-emitting module can be reduced. Further, since the viscous material layer is non-solid, it flows between the light-emitting element and the second substrate. Accordingly, a stress applied to the light-emitting element is reduced by the viscous material layer, so that damage to the light-emitting element can be prevented.

Furthermore, the drying agent included in the viscous material layer reacts with or adsorbs an impurity remaining in the light-emitting module and/or an impurity entering the light-emitting module from the outside of the module. Accordingly, deterioration of the light-emitting element can be prevented. Further, the viscous material layer provided in contact with the light-emitting element can release heat generated by driving of the light-emitting element, to the second substrate, so that deterioration of the light-emitting element caused by the heat can be reduced.

Furthermore, with the viscous material layer between the light-emitting element and the second substrate, a change in the size of the light-emitting element by expansion due to heat generation can be compensated for, which can prevents a stress generated between the light-emitting element and the second substrate from concentrating at the light-emitting element. Accordingly, damage to the light-emitting element can be prevented.

In addition, the portion in the second space which is connected to the first space through the narrow portion and is not filled with the viscous material layer can compensate for a change in the volume of the viscous material layer due to heat generation in the light-emitting module or can reduce a stress due to the volume change. Accordingly, it is possible to prevent the phenomenon in which the viscous material layer expands to break the sealing structure (e.g., the bond structure of the sealing material) of the light-emitting module. Furthermore, even when a chemical adsorption drying agent such as an oxide of an alkali metal or an oxide of an alkaline earth metal reacts with impurities to generate a gas or increases in volume in a sealed space, the volume change can be compensated for by the portion in the second space which is not filled with the viscous material layer.

Modification Example 2

As another modification example of the light-emitting module exemplified in this embodiment, a light-emitting module in which the second electrode 112, the viscous material layer 120, and the second substrate 102 each transmit light emitted from the layer 113 including an organic compound having a light-emitting property is described.

The viscous material layer 120 preferably transmits 95% or more of light emitted from the layer 113 including an organic compound having a light-emitting property, more preferably greater than or equal to 98% and less than 100% thereof so that light emitted from the light-emitting element 110 can be effectively extracted through the second substrate 102. Specifically, the viscous material layer 120 can have a visible light transmittance of 99% when formed to a thickness of 10 μm using a silicone fluid as the non-solid material having viscosity.

The refractive index of the viscous material layer 120 is especially preferably greater than or equal to the refractive index of the air, preferably greater than or equal to 1.3 and less than or equal to 1.7, more preferably greater than or equal to 1.4 and less than or equal to 1.6, and is preferably greater than or equal to the refractive index of the layer 113 including an organic compound having a light-emitting property and less than or equal to that of the second substrate 102. This is in order that light emitted from the light-emitting element 110 can be efficiently extracted to the outside through the second substrate 102.

Further, a portion which is not filled with the viscous material layer may be provided between the viscous material layer 120 and the frame 132. The portion which is not filled with the viscous material layer is preferably provided in that a stress generated when the viscous material layer 120 expands due to heat can be reduced.

Note that a sealing film covering the light-emitting element 110 may be provided between the light-emitting element 110 and the viscous material layer. The refractive index of the sealing film is preferably greater than or equal to the refractive index of the viscous material layer and less than or equal to that of the layer including an organic compound having a light-emitting property. The thickness of the sealing film is preferably greater than or equal to 1 nm and less than or equal to 500 nm.

In the light-emitting module of one embodiment of the present invention, components from the second electrode of the light-emitting element to the second substrate are each formed using a material having a light-transmitting property. Consequently, light emitted from the light-emitting element can be extracted through the second substrate. In addition, the second electrode of the light-emitting element and the second substrate are optically connected to each other by the viscous material layer, so that light emitted from the layer including an organic compound having a light-emitting property can be efficiently extracted through the second substrate. Accordingly, a light-emitting module having high emission efficiency can be provided. Further, a light-emitting module having lower power consumption can be provided. Further, a light-emitting module having high reliability can be provided. Further, a light-emitting module which is unlikely to cause a defect in light emission can be provided.

Modification Example 3

As a modification example of the light-emitting module exemplified in this embodiment, a light-emitting module in which the median particle size of the drying agent included in the viscous material layer 120 is greater than or equal to 10 nm and less than or equal to 400 nm is described.

The light-emitting module of one embodiment of the present invention includes the drying agent having a median particle size greater than or equal to 10 nm and less than or equal to 400 nm. The drying agent having a median particle size greater than or equal to 10 nm can inhibit breakdown of an adsorption site in it. The drying agent having a median particle size less than or equal to 400 nm can have such a large surface area as to easily react with and/or adsorb an impurity. Note that when the median particle size of the drying agent is less than or equal to 400 nm, although aggregation of the drying agent occurs easily in the viscous material layer, the aggregation can be prevented with a surface of the drying agent which is modified with a silane coupling agent. Alternatively, the aggregation can be prevented by ultrasonic wave irradiation when the drying agent is dispersed in the viscous material layer.

Furthermore, when the median particle size of the drying agent included in the viscous material layer 120 is greater than or equal to 10 nm and less than or equal to 400 nm in the structure in which the second electrode 112, the viscous material layer 120, and the second substrate 102 each transmit light emitted from the layer 113 including an organic compound having a light-emitting property, the phenomenon in which light emitted by the organic compound having a light-emitting property is scattered in the viscous material layer can be inhibited. Accordingly, a light-emitting module having high emission efficiency can be provided. Further, a highly reliable light-emitting module including an organic EL element can be provided. Further, a light-emitting module which is unlikely to cause a defect in light emission can be provided.

Modification Example 4

A modification example of the light-emitting module exemplified in this embodiment is described with reference to FIG. 2C. The upper part of FIG. 2C is a top view of the light-emitting module of one embodiment of the present invention and the lower part is a cross-sectional view along the cutting plane line A-B. A light-emitting module 200c of one embodiment of the present invention includes, between the light-emitting element 210 and the frame 232, an activation material layer 246 including an activation material which can activate the drying agent included in the viscous material layer 220.

In such a structure, the viscous material layer having fluidity flows in a space to be surrounded by the frame surrounding the light-emitting element. The drying agent included in the viscous material layer reacts with or adsorbs an impurity between the second electrode of the light-emitting element and the second substrate. Then, the drying agent which have reacted with or adsorbed an impurity comes in contact with the activation material layer provided between the light-emitting element and the frame, and is reactivated. Accordingly, a highly reliable light-emitting module including an organic EL element can be provided. Further, a light-emitting module which is unlikely to cause a defect in light emission can be provided.

Note that a recyclable drying agent is used for the viscous material layer. An example of the recyclable drying agent is a physically adsorbing type drying agent. As the activation material used for the activation material layer, a material which can extract physically adsorbed impurities such as moisture is necessary. Specifically, chemically adsorbing type drying agents such as oxides of alkali metals and oxides of alkaline earth metals is used as the activation material.

Note that this embodiment can be combined with any of the other embodiments in this specification as appropriate.

(Embodiment 2)

In this embodiment, a light-emitting device in which a plurality of light-emitting modules of one embodiment of the present invention is arranged in a matrix is described with reference to FIGS. 3A to 3C.

In this embodiment, an active matrix light-emitting device in which the light-emitting modules of one embodiment of the present invention are each connected to a transistor is described. However, the embodiment of the present invention is not limited to the active matrix light-emitting device and can also be applied to a passive matrix light-emitting device. Further, either light-emitting device can be used for a display device or a lighting device.

Active Matrix Light-Emitting Device

Figure 3A:
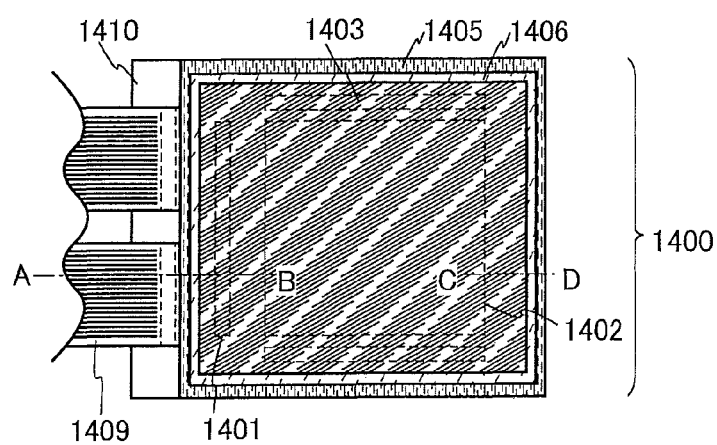
FIGS. 3A to 3C illustrate a light-emitting device according to one embodiment of the present invention.
Figure 3B:
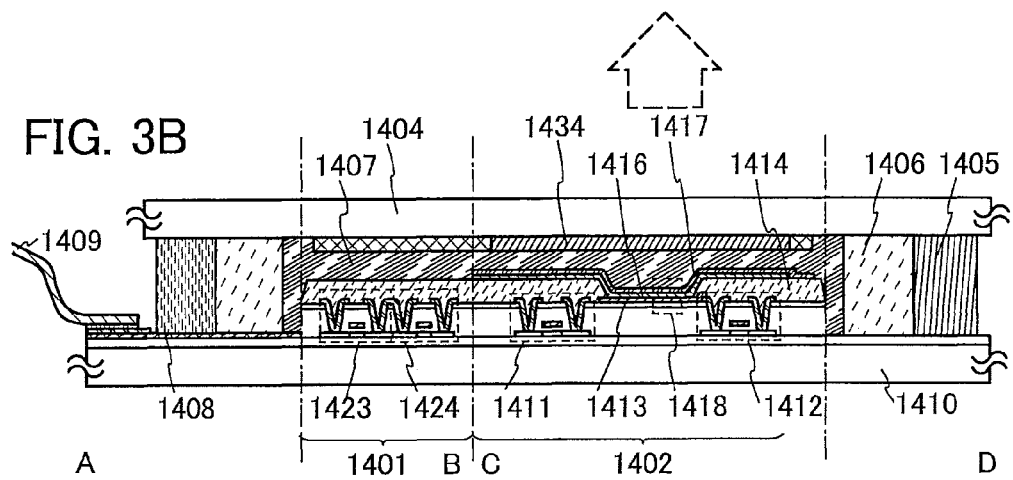
Figure 3C:
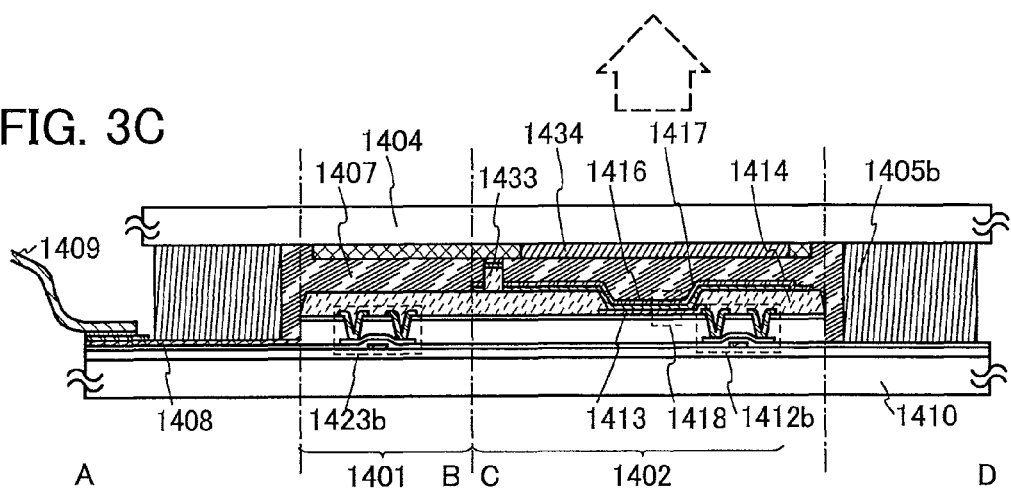

FIGS. 3A to 3C illustrate structures of the active matrix light-emitting device of one embodiment of the present invention. Note that FIG. 3A is a top view of the light-emitting device of one embodiment of the present invention, and FIG. 3B is a cross-sectional view taken along the lines A-B and C-D in FIG. 3A. A light-emitting device 1400 illustrated in FIG. 3B emits light in the direction denoted by the arrow in the drawing.

The active matrix light-emitting device 1400 includes a driver circuit portion (source driver circuit) 1401, a pixel portion 1402, a driver circuit portion (gate driver circuit) 1403, a second substrate 1404, and a sealing material 1405 (see FIGS. 3A and 3B). Note that a frame 1406 is provided to be surrounded by the sealing material 1405 while a space surrounded by the frame 1406 includes a viscous material layer 1407.

The light-emitting device 1400 receives a video signal, a clock signal, a start signal, a reset signal, and the like from a flexible printed circuit (FPC) 1409 that is an external input terminal. Note that only the FPC is illustrated here; however, the FPC may be provided with a printed wiring board (PWB). The light-emitting device in this specification includes, in its category, not only the light-emitting device itself but also the light-emitting device provided with the FPC or the PWB.

The detail of the structure of the light-emitting device 1400 is described with reference to the cross-sectional view in FIG. 3B. The light-emitting device 1400 includes, over a first substrate 1410, a driver circuit portion including the source driver circuit 1401 illustrated and the pixel portion 1402 including a pixel which is also illustrated. Further, the light-emitting device 1400 includes a lead wiring 1408 for transmitting signals that are to be input to the source driver circuit 1401 and the gate driver circuit 1403.

Note that although the source driver circuit 1401 including a CMOS circuit in which an n-channel transistor 1423 and a p-channel transistor 1424 are combined is exemplified in this embodiment, the driver circuit is not limited to this structure and may be any of a variety of circuits, such as a CMOS circuit, a PMOS circuit, or an NMOS circuit. Although this embodiment illustrates the driver-integrated type in which the driver circuits are formed over the substrate, the present invention is not limited to this, and the driver circuits may be formed outside the substrate, not over the substrate.

Transistor Structure 1

The active matrix light-emitting device exemplified in this embodiment can be formed by using a variety of transistors. Specifically, for a region where a channel is formed, a transistor using amorphous silicon, polysilicon, single crystal silicon, an oxide semiconductor, or the like can be used.

Use of a single crystal semiconductor for the region where a channel of a transistor is formed can reduce the size of the transistor, which results in higher resolution pixels in a display portion.

As a single crystal semiconductor used for forming a semiconductor layer, it is possible to use a semiconductor substrate, typical examples of which are a single crystal semiconductor substrate including an element belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate). Preferably, a silicon on insulator (SOI) substrate in which a single crystal semiconductor layer is provided on an insulating surface is used.

As a method of forming the SOI substrate, any of the following methods can be used: a method in which oxygen ions are implanted into a mirror-polished wafer and then heating is performed at high temperature, whereby an oxide layer is formed at a certain depth from a surface of the wafer and a defect caused in the surface layer is eliminated; a method in which a semiconductor substrate is separated by utilizing the growth of microvoids, which are formed by hydrogen ion irradiation, by heat treatment; a method in which a single crystal semiconductor layer is formed on an insulating surface by crystal growth; and the like.

In this embodiment, ions are added through one surface of a single crystal semiconductor substrate, and an embrittlement layer is formed at a certain depth from the surface of the single crystal semiconductor substrate. Then, an insulating layer is formed over the surface of the single crystal semiconductor substrate or over the first substrate 1410. Next, heat treatment is performed in the state in which the single crystal semiconductor substrate provided with the embrittlement layer and the first substrate 1410 are bonded to each other with the insulating layer interposed therebetween, so that a crack is generated in the embrittlement layer to separate the single crystal semiconductor substrate along the embrittlement layer. Thus, a single crystal semiconductor layer, which is separated from the single crystal semiconductor substrate, is formed as a semiconductor layer over the first substrate 1410. Note that a glass substrate can be used as the first substrate 1410.

Further, regions electrically insulated from each other may be formed in the semiconductor substrate so that transistors 1411 and 1412 may be formed using the regions electrically insulated from each other.

The use of the single crystal semiconductor as the channel formation region can reduce variation in the electric characteristics of transistors, such as threshold voltage, due to a bonding defect at a crystal grain boundary. Hence, in the light-emitting device of one embodiment of the present invention, the light-emitting element can operate normally without a circuit for compensating the threshold voltage in each pixel. Accordingly, the number of circuit elements in one pixel can be reduced, which increases the flexibility of layout. Thus, a high-resolution light-emitting device can be achieved. For example, a light-emitting device having a matrix of a plurality of pixels, specifically 350 or more pixels per inch (i.e., the horizontal resolution is 350 or more pixels per inch (ppi)), preferably 400 or more pixels per inch (i.e., the horizontal resolution is 400 or more ppi), can be achieved.

Moreover, a transistor whose channel formation region is formed using a single crystal semiconductor can be reduced in size while maintaining good current drive capability. The use of the transistor reduced in size leads to a reduction in the area of a circuit portion that does not contribute to display operation, resulting in an increase in the area of a region of the display portion where an image is displayed and a reduction in the frame size of the light-emitting device.

Pixel Portion Structure 1

The pixel portion 1402 includes a plurality of pixels. Each pixel includes a light-emitting element 1418, the current control transistor 1412 whose drain electrode is connected to a first electrode 1413 of the light-emitting element 1418, and the switching transistor 1411.

The light-emitting element 1418 provided in the light-emitting module includes the first electrode 1413, a second electrode 1417, and a layer 1416 including an organic compound having a light-emitting property. Note that a partition 1414 is formed to cover an edge portion of the first electrode 1413.

Further, the partition 1414 is formed such that an upper edge portion or a lower edge portion thereof has a curved surface with a curvature. The partition 1414 can be formed using either a negative photosensitive resin which becomes insoluble in an etchant by light irradiation or a positive photosensitive resin which becomes soluble in an etchant by light irradiation. For example, in the case of using positive photosensitive acrylic as a material for the partition 1414, it is preferable that the partition 1414 be formed to have a curved surface with a radius of curvature (0.2 $\mu$m to 3 $\mu$m) only at the upper edge portion thereof. Here, the partition 1414 is formed using a positive photosensitive polyimide film.

As a structure of the light-emitting element 1418, a structure of the light-emitting element exemplified in Embodiment 6 can be employed, for example.

Specifically, the layer 1416 including an organic compound having a light-emitting property can emit white light. A light-emitting module which provides light of different emission colors can be formed in such a way that color filters are provided to overlap with light-emitting elements which exhibit white light.

For example, when color filters which can transmit light of different colors are provided to overlap with light-emitting elements, a plurality of light-emitting modules which provides light of different colors can be provided without separately forming layers each including an organic compound having a light-emitting property for the individual light-emitting elements. In addition, when such light-emitting modules are formed to be capable of being driven independently of each other, a multicolor display device can be formed.

In addition, when a film having a light-blocking property (also referred to as black matrix) is provided to overlap with the partition, the amount of light from an adjacent light-emitting element, which enters one color filter, can be reduced. Accordingly, the color reproducibility of the display device can be improved.

In this embodiment, the case where light emitted from the light-emitting element 1418 is extracted through the second electrode 1417 is described. Specifically, the case where the second electrode 1417 is formed using an electrically conductive film which can transmit light emitted from the layer 1416 including an organic compound having a light-emitting property is described.

In this embodiment, the case where a microresonator (also referred to as microcavity) is formed using the first electrode 1413 and the second electrode 1417 in the light-emitting element 1418 is described. For example, the first electrode 1413 is formed using an electrically conductive film which reflects light emitted from the layer 1416 including an organic compound having a light-emitting property, and the second electrode 1417 is formed using a semi-transmissive and semi-reflective, electrically conductive film which reflects part of the light and transmits part of the light.

In addition, an optical adjustment layer can be provided between the first and second electrodes. The optical adjustment layer adjusts the optical path length between the reflective first electrode 1413 and the semi-transmissive and semi-reflective second electrode 1417. By adjustment of the thickness of the optical adjustment layer, the wavelength of light which is preferentially extracted through the second electrode 1417 can be controlled.

The layer including an organic compound having a light-emitting property can be employed for a material that can be used for the optical adjustment layer. For example, a charge generation region may be used to control the thickness of the optical adjustment layer. A region containing a substance having a high hole-transport property and an acceptor substance is especially preferably used for the optical adjustment layer, in which case an increase in drive voltage can be inhibited even when the optical adjustment layer is thick.

Alternatively, for a material that can be used for the optical adjustment layer, an electrically conductive film having a light-transmitting property which transmits light emitted from the layer 1416 including an organic compound having a light-emitting property can also be employed. For example, an electrically conductive film having a light-transmitting property is stacked over a surface of a reflective, electrically conductive film so that the first electrode 1413 can be formed. This structure is suitable for a reduction in the size of the display device in that the thicknesses of the optical adjustment layers over adjacent first electrodes can be varied by a photolithography process.

When light emitted from the light-emitting element 1418 is extracted through the second electrode 1417, the color filter 1434 and a film 1435 having a light-blocking property can be provided over the second substrate 1404.

Note that the distance between the second substrate 1404 provided with the color filter 1434 and the first substrate can be adjusted using the later-described sealing material 1405, the frame 1406, or the like. The color filter 1434 is preferably provided close to the light-emitting element 1418. When the distance between color filters is less than or equal to the distance between adjacent light-emitting elements (the width of a partition), the amount of light from an adjacent light-emitting element, which enters one color filter, from the adjacent light-emitting element can be reduced. Accordingly, the color reproducibility of the display device can be improved.

Note that the partition 1414 having a light-blocking property can inhibit reflection of external light by a reflective film provided in the light-emitting module. The reflection of external light by a reflective film which extends outside the light-emitting element 1418 leads to the lower contrast by the light-emitting device; for that reason, bright light emission is hindered. When the partition has a light-blocking property, a resin layer colored in black can be used to form it.

Sealing Structure 1

The light-emitting device 1400 exemplified in this embodiment has a structure in which the light-emitting element 1418 is sealed in a space enclosed by the first substrate 1410, the second substrate 1404, and the sealing material 1405.

The frame 1406 is provided in the space and surrounds the light-emitting element 1418 and the viscous material layer 1407. The space may be tightly filled with the viscous material layer 1407 or a portion which is not filled with it may remain in part of the space. The remaining portion may be filled with an inert gas (e.g., nitrogen or argon). The portion filled with an inert gas is preferably provided in that a stress generated when the viscous material layer 1407 expands due to heat can be reduced. Further, an adsorbent which adsorbs an impurity, such as a drying agent, may be provided in the remaining portion.

The light-emitting device of one embodiment of the present invention has a structure in which the transistor formed over the first substrate, the light-emitting element which is formed over the first substrate and connected to the transistor, and the viscous material layer are sealed in a space between the first and second substrates which face each other, with the sealing material surrounding the light-emitting element. The viscous material layer is surrounded by the frame, in contact with the light-emitting element and provided between the first and second substrates, and includes a non-solid material having viscosity and a drying agent that reacts with an impurity (typically water and/or oxygen) or adsorbs an impurity.

Since the light-emitting element is enclosed by the first substrate, the second substrate, the sealing material bonding the first and second substrates, and the viscous material layer, entry of impurities into the light-emitting device can be reduced. Further, since the viscous material layer is non-solid, it flows between the light-emitting element and the second substrate. Accordingly, a stress applied to the light-emitting element is reduced by the viscous material layer, so that damage to the light-emitting element can be prevented. Furthermore, the drying agent included in the viscous material layer reacts with or adsorbs an impurity remaining in the light-emitting device and/or an impurity entering the light-emitting device from the outside of the device. Accordingly, deterioration of the light-emitting element can be prevented. Further, the viscous material layer provided in contact with the light-emitting element can release heat generated by driving of the light-emitting element, to the second substrate, so that deterioration of the light-emitting element caused by the heat can be reduced. Furthermore, a stress generated between the light-emitting element and the second substrate because of a change in the size of the light-emitting element due to the heat generation can be reduced by the viscous material layer between the light-emitting element and the second substrate, so that damage to the light-emitting element can be prevented.

Accordingly, a highly reliable light-emitting device including an organic EL element can be provided. Further, a light-emitting device which is unlikely to cause a defect in light emission can be provided.

Modification Example

As a modification example of the light-emitting device exemplified in this embodiment, a light-emitting device which includes a transistor including an oxide semiconductor layer in a channel formation region and in which the transistor and the viscous material layer are sealed with a sealing material surrounding a light-emitting element is described with reference to FIG. 3C. Note that the viscous material layer includes a drying agent which can react with or adsorb an impurity (typically water) and a non-solid material having viscosity The light-emitting device exemplified in FIG. 3C includes, over the first substrate 1410, a driver circuit portion including the source driver circuit 1401 illustrated and the pixel portion 1402 including a pixel which is also illustrated. Further, the light-emitting device includes the lead wiring 1408 for transmitting signals that are to be input to the source driver circuit 1401 and the gate driver circuit 1403.

Note that in this modification example, a structure including a circuit in which an n-channel transistor 1423*b* is used for the source driver circuit 1401 is exemplified. Although a driver-integrated type in which the driver circuits are formed over the substrate is described in this modification example, the driver circuits are not necessarily formed over the substrate but can be formed outside it.

Transistor Structure 2

In the modification example of the active matrix light-emitting device exemplified in this embodiment, the transistor using an oxide semiconductor in a region where a channel is formed is employed.

The transistor using an oxide semiconductor in a region where a channel is formed facilitates manufacture over a large substrate and enables higher-speed operation as compared with a transistor using amorphous silicon.

As a structure of the transistor using an oxide semiconductor in a region where a channel is formed, a structure of a transistor exemplified in Embodiment 7, for example, can be used.

Note that a hydrogen ion or a hydrogen molecule in the oxide semiconductor acts as an impurity which increases the carrier concentration in the oxide semiconductor. Consequently, dispersion of an impurity including a hydrogen atom in the transistor using an oxide semiconductor in a region where a channel is formed impairs the properties of the transistor and even eliminates the reliability of the light-emitting device using the transistor. The impurity including a hydrogen atom remains in and/or enters the light-emitting device using the oxide semiconductor from the outside of the device. In particular, it is difficult to completely remove moisture from the light-emitting device and/or to completely prevent entry of moisture from the air.

Pixel Portion Structure 2

The pixel portion 1402 exemplified in FIG. 3C includes a plurality of pixels. Each pixel includes the light-emitting element 1418 and the current control transistor 1412*b* whose source electrode or drain electrode is connected to the first electrode 1413 of the light-emitting element 1418. In the modification example of the active matrix light-emitting device exemplified in this embodiment, the transistor using an oxide semiconductor in a region where a channel is formed is employed.

Note that the distance between the second substrate 1404 provided with the color filter 1434 and the first substrate can be adjusted using the sealing material 1405, a spacer 1433, or the like.

The spacer 1433 can be formed over the partition 1414 by a photolithography process, for example. The spacer 1433 provided in the pixel portion blocks at least part of light emitted from the light-emitting element 1418, so that entry of light to a color filter provided in an adjacent pixel (this phenomenon can also be referred to as optical crosstalk) can be reduced.

Further, the color filter 1434 is preferably provided close to the light-emitting element 1418. When the distance between color filters is less than or equal to the distance between adjacent light-emitting elements (the width of the partition), the amount of light from an adjacent light-emitting element, which enters one color filter, can be reduced. Accordingly, the color reproducibility of the light-emitting device can be improved. Further, in the light-emitting device exemplified in the modification example of this embodiment, since the spacer 1433 is provided in the pixel portion, the distance between the color filter 1434 and the light-emitting element 1418 can be uniformly adjusted in the pixel portion.

Sealing Structure 2

The light-emitting device exemplified in FIG. 3C has a structure in which the light-emitting element 1418 is sealed in a space enclosed by the first substrate 1410, the second substrate 1404, and a sealing material 1405*b*.

The light-emitting element 1418 and the viscous material layer 1407 are provided in the space. The sealing material 1405*b* surrounds the light-emitting element 1418 and the viscous material layer 1407. In other words, the sealing material 1405*b* included in the light-emitting device exemplified in FIG. 3C have both functions of the sealing material 1405 and the frame 1406 which are included in the light-emitting device exemplified in FIG. 3B. Specifically, the sealing material 1405*b* included in the light-emitting device exemplified in FIG. 3C has the effect of bonding the first substrate 1410 and the second substrate 1404 and to seal, therebetween, the light-emitting element 1418 and the viscous material layer 1407.

For the sealing material 1405*b*, a material which does not react with the viscous material layer 1407 is used. Specific examples of the material applicable to the sealing material 1405*b* are glass frit, glass ribbon, and the like.

Note that the space may be tightly filled with the viscous material layer 1407 or a portion which is not filled with it may remain in part of the space. The remaining portion may be filled with an inert gas (e.g., nitrogen or argon). The portion filled with an inert gas is preferably provided in that a stress generated when the viscous material layer 1407 expands due to heat can be reduced. Further, an adsorbent which adsorbs an impurity, such as a drying agent, may be provided in the remaining portion.

Viscous Material Layer

The viscous material layer 1407 includes a drying agent and a non-solid material having viscosity. In addition, the viscous material layer 1407 has fluidity and includes a viscous material whose viscosity is preferably typically greater than or equal to 1 cp and less than or equal to 500 cp.

The drying agent includes a material which reacts with or adsorbs an impurity, preferably, typically a material which reacts with or adsorbs water and/or oxygen or a material which adsorbs water and/or oxygen. Note that in the modification example of the light-emitting device exemplified in this embodiment, the impurity means not only a substance which reduces the reliability of the light-emitting element but also a substance which increases the carrier concentration in the oxide semiconductor used for the region of the transistor where a channel is formed. Typical examples of the impurity are a hydrogen ion, a hydrogen molecule, and the like, in addition to water and oxygen. Examples of the material applicable to the drying agent are chemically adsorbing type drying agents such as oxides of alkali metals and oxides of alkaline earth metals, physically adsorbing type drying agents such as a zeolite, silica gel, aluminum oxide, and allophone, and the like.

The non-solid material having viscosity has fluidity while containing the drying agent. Examples of the material applicable to the non-solid material having viscosity are straight silicone fluids, modified silicone fluids, liquid paraffins, perfluorocarbons, and the like.

Since the transistor including the oxide semiconductor layer in a channel formation region and the light-emitting element are enclosed by the first substrate, the second substrate, the sealing material bonding the first and second substrates, and the viscous material layer, entry of impurities into the light-emitting device can be reduced. Furthermore, the drying agent included in the viscous material layer reacts with or adsorbs an impurity remaining in the light-emitting device and/or an impurity entering the light-emitting device from the outside of the device. Accordingly, an impurity including a hydrogen atom (typically water) can be prevented from reducing the reliability of the transistor including the oxide semiconductor layer in a channel formation region.

Accordingly, a highly reliable light-emitting device including an organic EL element can be provided. Further, a light-emitting device which is unlikely to cause a defect in light emission can be provided.

Note that this embodiment can be combined with any of the other embodiments in this specification as appropriate.
(Embodiment 3)

In this embodiment, a light-emitting device in which a plurality of light-emitting modules of one embodiment of the present invention is arranged in a matrix is described with reference to FIGS. 4A and 4B. Note that the light-emitting device exemplified in this embodiment includes a first space overlapping with a pixel portion and a second space connected to the first space through a narrow portion.

In this embodiment, an active matrix light-emitting device in which the light-emitting modules of one embodiment of the present invention are each connected to a transistor is described. However, the embodiment of the present invention is not limited to the active matrix light-emitting device and can also be applied to a passive matrix light-emitting device. Further, either light-emitting device can be used for a display device or a lighting device.

Active Matrix Light-Emitting Device

Figure 4A:
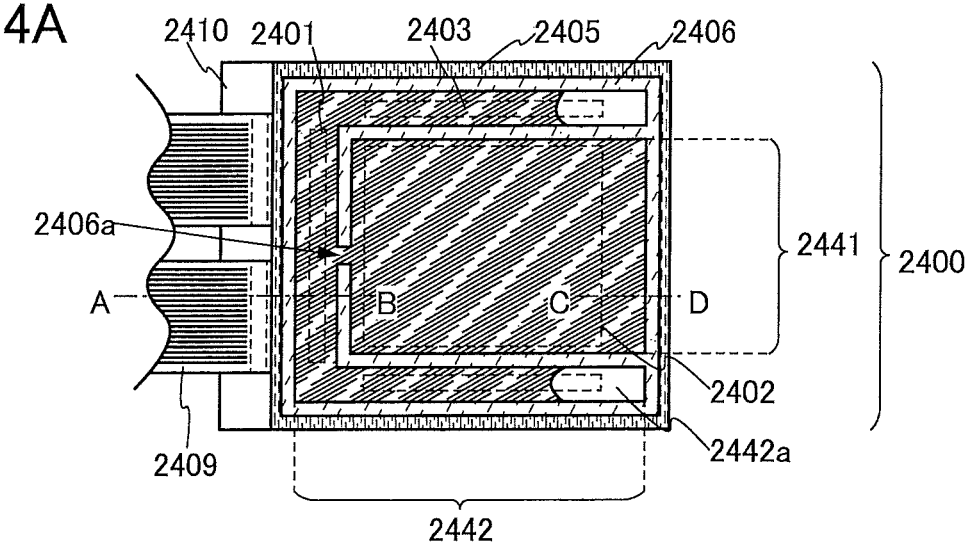
FIGS. 4A and 4B illustrate a light-emitting device according to one embodiment of the present invention.
Figure 4B:
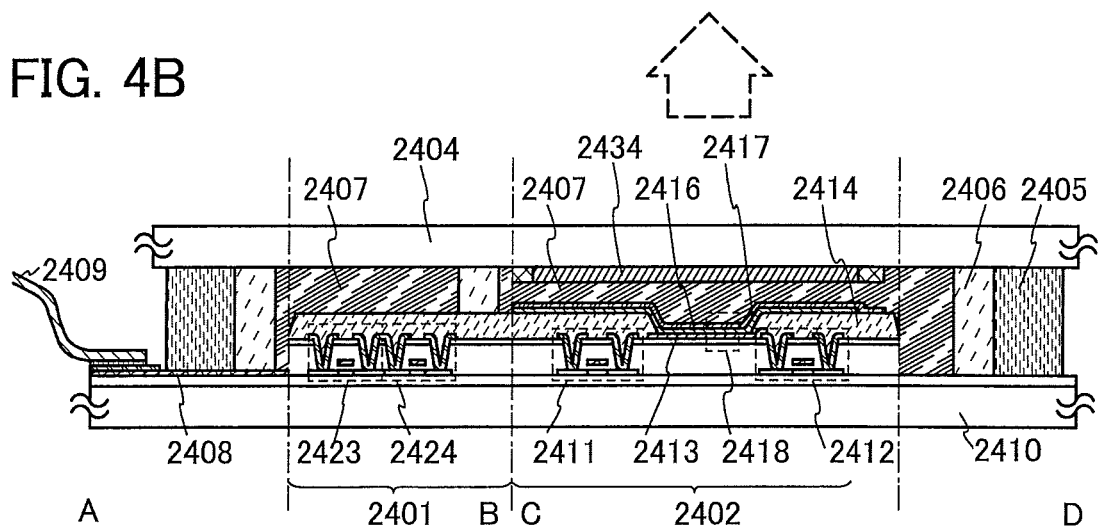

FIGS. 4A and 4B illustrate a structure of the active matrix light-emitting device of one embodiment of the present invention. Note that FIG. 4A is a top view of the light-emitting device of one embodiment of the present invention, and FIG. 4B is a cross-sectional view taken along the lines A-B and C-D in FIG. 4A. A light-emitting device 2400 illustrated in FIG. 4B emits light in the direction denoted by the arrow in the drawing.

The active matrix light-emitting device 2400 includes a driver circuit portion (source driver circuit) 2401, a pixel portion 2402, a driver circuit portion (gate driver circuit) 2403, a second substrate 2404, and a sealing material 2405 (see FIGS. 4A and 4B). Note that a frame 2406 is provided to be surrounded by the sealing material 2405 while a space surrounded by the frame 2406 includes a viscous material layer 2407. Further, the frame 2406 surrounds a first space 2441 overlapping with the pixel portion 2402 and a second space 2442 overlapping with the driver circuits 2401 and 2403. The first space 2441 and the second space 2442 are connected through the narrow portion 2406a. At least a portion 2442a of the second space 2442 is not filled with the viscous material layer 2407.

The narrow portion 2406a is an opening provided in the frame 2406 and allows the viscous material layer 2407 to flow between the first space 2441 and the second space 2442. The narrow portion 2406a also prevents the portion 2442a provided in the second space 2442 which is not filled with the viscous material layer from moving toward the first space 2441. Note that the cross-sectional shape of the second space 2442 is not limited to the shape which extends from the narrow portion 2406a. For example, the second space 2442 may have a tubular shape with a cross section having substantially the same area as the narrow portion or may have a meandering shape to have a sufficient volume.

Since the pixel portion 2402 is enclosed by the first substrate 2410, the second substrate 2404, the sealing material 2405 bonding the first substrate 2410 and the second substrate 2404, and the viscous material layer 2407, entry of impurities into the light-emitting device 2400 can be inhibited. Further, since the viscous material layer 2407 is a non-solid material, it flows between the light-emitting element 2418 and the second substrate 2404. Accordingly, a stress applied to the light-emitting element 2418 is reduced by the viscous material layer 2407, so that damage to the light-emitting element 2418 can be prevented.

Furthermore, a drying agent included in the viscous material layer 2407 reacts with or adsorbs an impurity remaining in the light-emitting device 2400 and/or an impurity entering the light-emitting device 2400 from the outside. Accordingly, deterioration of the light-emitting element 2418 can be prevented. Further, heat generated by driving of the light-emitting element 2418 can be released to the second substrate 2404, so that deterioration of the light-emitting element 2418 caused by the heat can be reduced.

Furthermore, a stress generated between the light-emitting element 2418 and the second substrate 2404 because of a change in the size of the light-emitting element due to the heat generation can be reduced by the viscous material layer 2407 provided between the light-emitting element 2418 and the second substrate 2404, so that damage to the light-emitting device 2400 can be prevented.

In addition, the portion in the second space which is connected to the first space through the narrow portion and is not filled with the viscous material layer can compensate for a change in the volume of the viscous material layer 2407 due to the heat generation in the light-emitting module or can reduce a stress due to the volume change. Accordingly, it is possible to prevent the phenomenon in which the viscous material layer 2407 expands to break the sealing structure (e.g., the bond structure of the sealing material 2405) of the light-emitting device.

The light-emitting device 2400 receives a video signal, a clock signal, a start signal, a reset signal, and the like from an FPC (flexible printed circuit) 2409 that is an external input terminal. Note that only the FPC is illustrated here; however, the FPC may be provided with a printed wiring board (PWB). The light-emitting device in this specification includes, in its category, not only the light-emitting device itself but also the light-emitting device provided with the FPC or the PWB.

The detail of the structure of the light-emitting device 2400 is described with reference to the cross-sectional view in FIG. 4B. The light-emitting device 2400 includes, over the first substrate 2410, a driver circuit portion including the source driver circuit 2401 illustrated and the pixel portion 2402 including a pixel which is also illustrated. Further, the light-emitting device 2400 includes a lead wiring 2408 for transmitting signals that are to be input to the source driver circuit 2401 and the gate driver circuit 2403.

Note that although the source driver circuit 2401 including a CMOS circuit in which an n-channel transistor 2423 and a p-channel transistor 2424 are combined is exemplified in this embodiment, the driver circuit is not limited to this structure and may be any of a variety of circuits, such as a CMOS circuit, a PMOS circuit, or an NMOS circuit. Although this embodiment illustrates the driver-integrated type in which the driver circuits are formed over the substrate, the present invention is not limited to this, and the driver circuits may be formed outside the substrate, not over the substrate.

Note that this embodiment can be combined with any of the other embodiments in this specification as appropriate.

(Embodiment 4)

In this embodiment, a method of manufacturing a light-emitting module of one embodiment of the present invention is described. Specifically, a manufacturing method in which, subsequent to the step of dripping a non-solid material having viscosity which includes a drying agent that reacts with or adsorbs an impurity into a region surrounded by a frame, a first substrate and a second substrate are bonded with a sealing material so that a light-emitting element, the frame, and the non-solid material can be sealed inside is described with reference to FIGS. 5A to 5D.

First Step

Figure 5A:
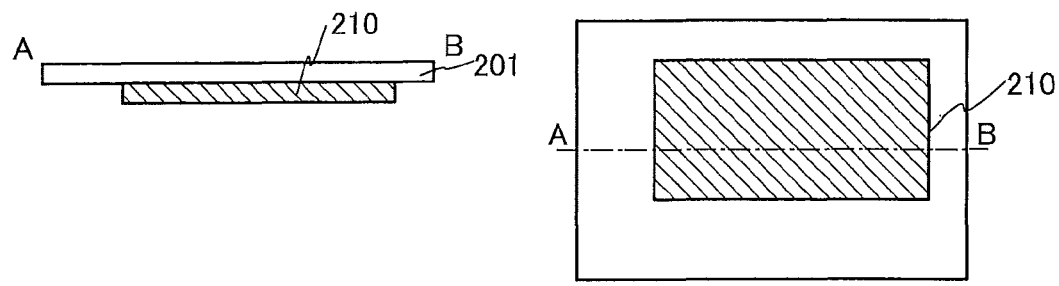
FIGS. 5A to 5D illustrate a method of manufacturing a light-emitting module according to one embodiment of the present invention.

First, the light-emitting element 210 is formed over the first substrate 201 (see FIG. 5A). Note that in FIGS. 5A to 5D, the detailed structure of the light-emitting element 210 (a first terminal, a second terminal, and the like) is not illustrated. For example, a structure exemplified in Embodiment 1 can be applied to the light-emitting element 210.

An example of a method of manufacturing the light-emitting element 210 is described. For example, over the first substrate using non-alkali glass, a reflective, electrically conductive film in which a Ti thin film is stacked over a Ni—Al—La alloy is formed using a sputtering method, and through a photolithography process, an island-shaped electrically conductive film, a first terminal electrically connected thereto, and a second terminal to which a second electrode is to be electrically connected later are formed. Next, an insulating partition having an opening is formed over the island-shaped electrically conductive film. A portion of the electrically conductive film which can be seen through the opening serves as the first electrode.

Next, the layer including an organic compound having a light-emitting property is formed to cover the first electrode. The second electrode is formed so that the layer including an organic compound having a light-emitting property can be formed between the second electrode and the first electrode. Note that the second electrode is electrically connected to the second terminal.

Second Step

Figure 5B:
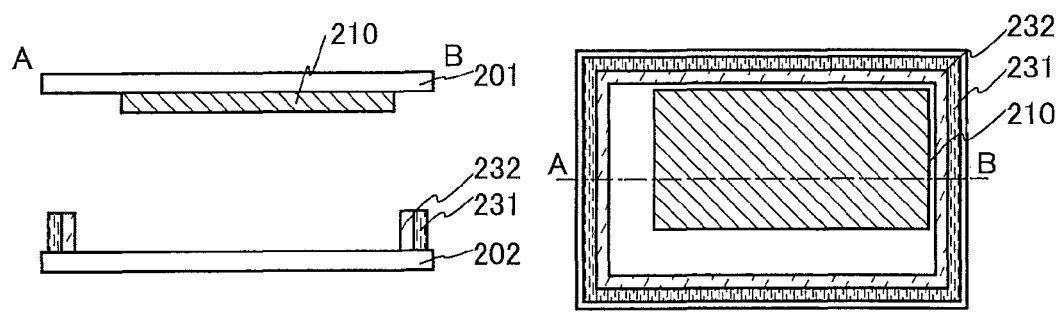
Figure 5C:
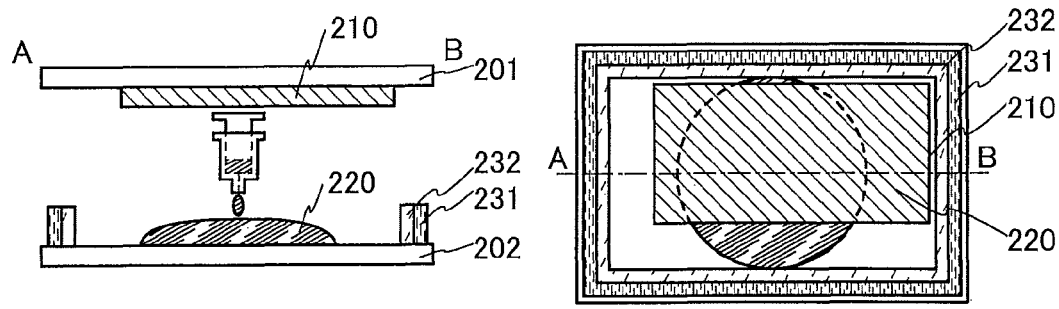
Figure 5D:
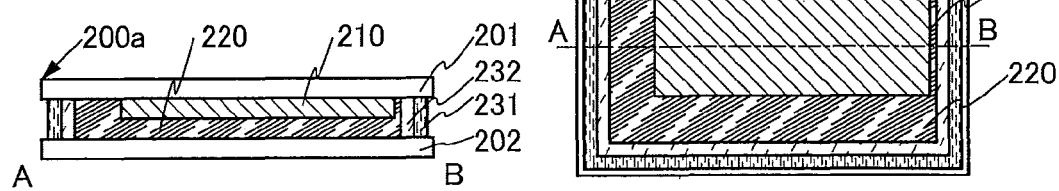

Next, the frame 232 which is to surround the light-emitting element 210 and the sealing material 231 which is to surround the frame 232 are formed over the second substrate 202 (see FIG. 5B). Note that there is no particular limitation on the order of forming the frame 232 and the sealing material 231.

The frame 232 can be formed in such a way that a photoresist, an acrylic resin, a polyimide, or the like is processed using a photolithography process, for example. Alternatively, an inkjet method or a dispensing method can be used for the formation.

In formation of the sealing material 231, a method suitable for its material is selected. For example, when a curable resin (such as an epoxy resin or a silicone resin) is used, a dispensing method or the like is used to form the sealing material 231, or when glass frit is used, prebaking follows application of a liquid in which glass frit is dispersed using a dispensing method or the like to form the sealing material 231.

Third Step

Next, a viscous material is dripped into the region surrounded by the frame 232 over the second substrate. The viscous material includes the drying agent that reacts with or adsorbs an impurity. Since the viscous material is the non-solid material having viscosity, it spreads in the region surrounded by the frame 232 (see FIG. 5C). For a method of dripping the viscous material, for example, a manufacturing apparatus employing a one drop fill (ODF) method, which is used for manufacture of a liquid crystal display device, can be used. When the viscous material is dripped with a manufacturing apparatus employing an ODF method, manufacturing time can be shortened in the manufacture of a display device with a short distance between the first substrate and the second substrate or a large display device. Alternatively, a potting device can be used.

Fourth Step

Next, the first substrate 201 and the second substrate 202 are bonded using the sealing material 231 so that the light-emitting element 210, the viscous material layer 220, and the frame 232 can be sealed in a space surrounded by the sealing material 231.

In order that the amount of the viscous material layer 220 sealed in a space enclosed by the first substrate 201, the second substrate 202, and the frame 232 can be adjusted, the amount of the viscous material which is to be dripped is changed. Alternatively, in the case where not only the viscous material but also a gas with fewer impurities (e.g., dry nitrogen or an inert gas such as an argon gas) is sealed, the composition and pressure of the gas which fills the environment where the first substrate 201 and the second substrate 202 are bonded, as well as the amount of the viscous material, are adjusted.

For example, the viscous material having the same volume as the space enclosed by the first substrate 201, the second substrate 202, and the frame 232 is dripped in a reduced pressure environment, so that the space can be filled with the viscous material layer 220. Further, in the case where the amount of the viscous material to be dripped is reduced, a reduced pressure space, as well as the viscous material layer 220, can be provided in the space.

In the case where the viscous material having a smaller volume than the space enclosed by the first substrate 201, the second substrate 202, and the sealing material 231 is dripped into the region enclosed by the first substrate 201 and the frame 232 in a gas with fewer impurities, the gas with fewer impurities, as well as the viscous material layer 220, can be sealed into the space.

The space which is not sealed with the viscous material and which has a reduced pressure or is filled with the gas can compensate for a change in the volume of the viscous material layer which is due to heat generation in the light-emitting module or can reduce a stress due to the volume change. Accordingly, it is possible to prevent the phenomenon in which the viscous material layer expands with heat to break the sealing structure (e.g., the bond structure of the sealing material) of the light-emitting module.

As a method of bonding the first substrate 201 and the second substrate 202, a method suitable for the material used for the sealing material 231 is selected. For example, with the use of a curable resin (such as an epoxy resin or a silicone resin), the sealing material 231 can be cured in such a way that ultraviolet rays are applied when the resin is an ultraviolet curable resin or that heat is applied when the resin is a thermosetting resin. Further, with the use of glass frit, for example, the first substrate 201 and the second substrate 202 can be welded with the sealing material 231 by irradiation with laser light having a wavelength which can be absorbed by the glass frit.

Modification Example

As a modification example of the method of manufacturing a light-emitting module exemplified in this embodiment, the following method is described: a method of manufacturing a light-emitting module including a first step of forming a light-emitting element and a frame to surround the light-emitting element over a first substrate, a second step of forming a sealing material to surround the frame over a second substrate, a third step of dripping a non-solid material having viscosity which includes a drying agent that reacts with or adsorbs an impurity into a region surrounded by the frame, and a fourth step of bonding the first substrate and the second substrate using the sealing material, whereby the light-emitting element, the non-solid material, and the frame are sealed inside.

In this manufacturing method, the first electrode of the light-emitting element and the frame are formed over the first substrate. Hence, these can be sequentially formed using the same processing method (e.g., a photolithography method), and consequently the manufacturing process can be simplified.

In the above method of manufacturing a light-emitting module of one embodiment of the present invention, subsequent to the step of dripping a non-solid material having viscosity which includes a drying agent that reacts with or adsorbs an impurity into a region surrounded by the frame, the first substrate and the second substrate are bonded with the sealing material so that the light-emitting element, the frame, and the non-solid material can be sealed inside.

Accordingly, the viscous material layer including the non-solid material can be efficiently formed between the first substrate and the second substrate which are large substrates.

Accordingly, a highly reliable light-emitting module including an organic EL element can be manufactured. Further, a light-emitting module which is unlikely to cause a defect in light emission can be manufactured.

Note that this embodiment can be combined with any of the other embodiments in this specification as appropriate.

(Embodiment 5)

In this embodiment, a method of manufacturing a light-emitting device of one embodiment of the present invention is described. Specifically, a manufacturing method in which, subsequent to the step of dripping a non-solid material having viscosity which includes a drying agent that reacts with or adsorbs an impurity into a region surrounded by a frame, a first substrate and a second substrate are bonded with a sealing material so that transistors, light-emitting elements, the frame, and the non-solid material can be sealed inside is described using FIGS. 6A to 6D.

First Step

Figure 6A:
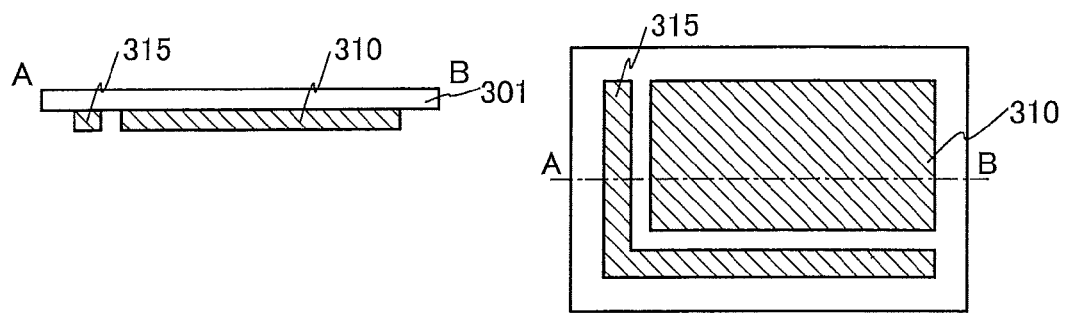
FIGS. 6A to 6D illustrate a method of manufacturing a light-emitting device according to one embodiment of the present invention.

First, a pixel portion 310 including the light-emitting elements and a transistor and a driver circuit 315 including a transistor are formed over a first substrate 301 (see FIG. 6A). Note that the detailed structures of the pixel portion 310 and the driver circuit 315 are not illustrated in FIGS. 6A to 6D.

A structure exemplified in Embodiment 1 can be applied to the light-emitting elements provided in the pixel portion 310. Transistors that can be formed in the same step can be used for the pixel portion 310 and the driver circuit 315. For example, a transistor exemplified in Embodiment 7 can be used.

An example of a method of fabricating the pixel portion 310 is described. For example, the transistors are formed over a surface of the first substrate 301 using non-alkali glass in accordance with the method exemplified in Embodiment 7. Further, a wiring, a capacitor, and the like are formed in addition to the transistors, and thus the pixel portion and the driver circuit portion are fabricated.

Next, the first electrode which is electrically connected to the source electrode or drain electrode of the transistor is formed. As the first electrode, for example, a reflective, electrically conductive film in which a Ti thin film is stacked over a Ni—Al—La alloy is formed using a sputtering method, and an island-shaped electrically conductive film is formed for each pixel through a photolithography process. Next, an insulating partition having an opening overlapping with each island-shaped electrically conductive film is formed. A portion of the electrically conductive film which is seen through the opening serves as the first electrode for the plurality of light-emitting elements.

Next, the layer including an organic compound having a light-emitting property is formed to cover the first electrode. The second electrode is formed so that the layer including an organic compound having a light-emitting property can be formed between the second electrode and the first electrode.

Second Step

Figure 6B:
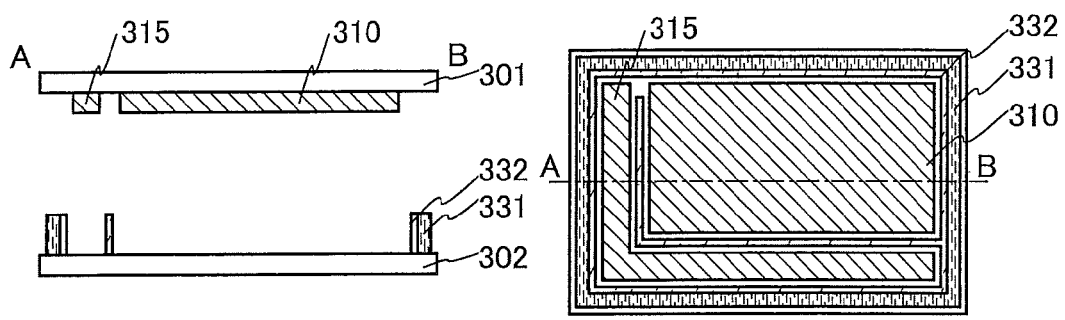
Figure 6C:
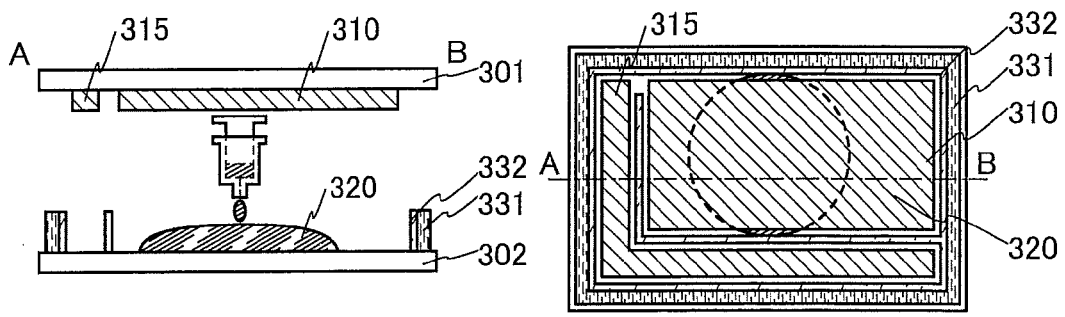
Figure 6D:
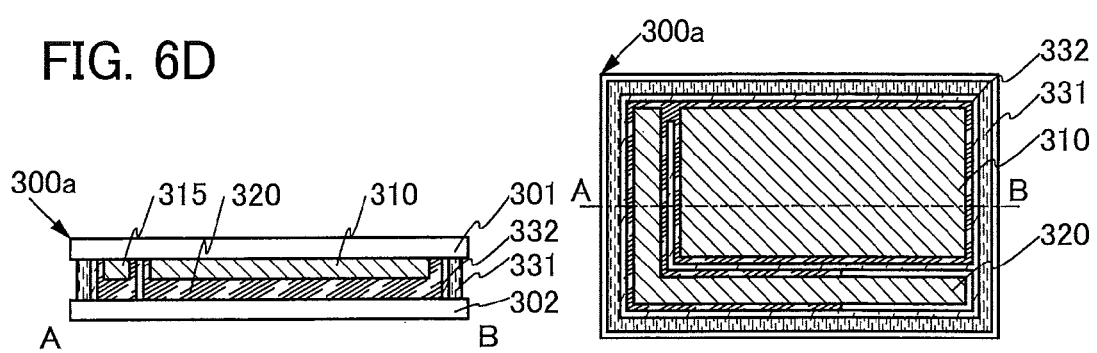

Next, a frame 332 which is to surround the pixel portion 310 and the sealing material 331 which is to surround the frame 332 are formed over a second substrate 302 (see FIG. 6B). Note that there is no particular limitation on the order of forming the frame 332 and the sealing material 331.

The frame 332 can be formed in such a way that a photoresist, an acrylic resin, a polyimide, or the like is processed using a photolithography process, for example. Alternatively, an inkjet method or a dispensing method can be used for the formation. Note that the frame 332 exemplified in this embodiment includes a narrow portion and is provided so that a portion where a first space overlapping with the pixel portion 310 is formed and a portion where a second space overlapping with the driver circuit 315 is faulted can be formed.

In formation of the sealing material 331, a method suitable for its material is selected. For example, when a curable resin (such as an epoxy resin or a silicone resin) is used, a dispensing method or the like is used to form the sealing material 331, or when glass frit is used, prebaking follows application of a liquid in which glass frit is dispersed using a dispensing method or the like to form the sealing material 331.

Third Step

Next, a viscous material is dripped into the region surrounded by the frame 332 over the second substrate. The viscous material includes the drying agent that reacts with or adsorbs an impurity. Since the viscous material is the non-solid material having viscosity, it spreads in the region surrounded by the frame 332 (see FIG. 6C). Note that when the second space connected to the first space through the narrow portion is provided, the viscous material is dripped into the space where the first space is formed. Dripping the viscous material into the space where the first space is formed enables the viscous material to fill the first space before the second space.

Fourth Step

Next, the first substrate 301 and the second substrate 302 are bonded using the sealing material 331 so that the pixel portion 310, the viscous material layer 320, and the frame 332 can be sealed in a space surrounded by the sealing material 331.

In order that the amount of the viscous material layer 320 sealed in a space enclosed by the first substrate 301, the second substrate 302, and the frame 332 can be adjusted, the amount of the viscous material which is to be dripped is changed. Alternatively, in the case where not only the viscous material but also a gas with fewer impurities (e.g., dry nitrogen or an inert gas such as an argon gas) is sealed, the composition and pressure of the gas which fills the environment where the first substrate 301 and the second substrate 302 are bonded, as well as the amount of the viscous material, are adjusted.

For example, the viscous material having the same volume as the space enclosed by the first substrate 301, the second substrate 302, and the frame 332 is dripped in a reduced pressure environment, so that the space can be filled with the viscous material layer 320. Further, in the case where the amount of the viscous material to be dripped is reduced, a reduced pressure space, as well as the viscous material layer 320, can be provided in the space.

In the case where the viscous material having a smaller volume than the space enclosed by the first substrate 301, the second substrate 302, and the frame 332 is dripped into the region enclosed by the first substrate 301 and the frame 332 in a gas with fewer impurities, the gas with fewer impurities, as well as the viscous material layer 320, can be sealed into the space.

The space which is not sealed with the viscous material and which has a reduced pressure or is filled with the gas can compensate for a change in the volume of the viscous material layer which is due to heat generation in the light-emitting device or can reduce a stress due to the volume change. Accordingly, it is possible to prevent the phenomenon in which the viscous material layer expands with heat to break the sealing structure (e.g., the bond structure of the sealing material) of the light-emitting module.

As a method of bonding the first substrate 301 and the second substrate 302, a method suitable for the material used for the sealing material 331 is selected. For example, with the use of a curable resin (such as an epoxy resin or a silicone resin), the sealing material 331 can be cured in such a way that ultraviolet rays are applied when the resin is an ultraviolet curable resin or that heat is applied when the resin is a thermosetting resin. Further, with the use of glass frit, for example, the first substrate 301 and the second substrate 302 can be welded with the sealing material 331 by irradiation with laser light having a wavelength which can be absorbed by the glass frit.

Note that a multicolor light-emitting device can be formed with pixels exhibiting white light, which are formed in the pixel portion over the first substrate 301, and color filters corresponding to the pixels, which are formed over the second substrate 302.

Modification Example

As a modification example of the method of manufacturing a light-emitting device exemplified in this embodiment, the following method is described: a method of manufacturing a light-emitting device including a first step of forming a pixel portion and a frame to surround the pixel portion over a first substrate, a second step of forming a sealing material to surround the frame over a second substrate, a third step of dripping a non-solid material having viscosity which includes a drying agent that reacts with or adsorbs an impurity into a region surrounded by the frame, and a fourth step of bonding the first substrate and the second substrate using the sealing material, whereby the transistor, the light-emitting element, the non-solid material, and the frame are sealed inside.

In this manufacturing method, the pixel portion and the frame are formed over the first substrate. Hence, these can be sequentially formed using the same processing method (e.g., a photolithography method), and consequently the manufacturing process can be simplified.

In the above method of manufacturing a light-emitting device of one embodiment of the present invention, subsequent to the step of dripping a non-solid material having viscosity which includes a drying agent that reacts with or adsorbs an impurity into a region surrounded by the frame, the first substrate and the second substrate are bonded with the sealing material so that the light-emitting element, the frame, and the non-solid material can be sealed inside.

Accordingly, the viscous material layer including the non-solid material can be efficiently formed between the first substrate and the second substrate which are large substrates.

A highly reliable light-emitting device including an organic EL element can be manufactured. Further, a light-emitting device which is unlikely to cause a defect in light emission can be manufactured.

Note that this embodiment can be combined with any of the other embodiments in this specification as appropriate.

(Embodiment 6)

In this embodiment, a structure of a light-emitting element which can be used for the light-emitting module or light-emitting device of one embodiment of the present invention is described. Specifically, an example of a light-emitting element in which a layer including an organic compound having a light-emitting property is interposed between a pair of electrodes is described with reference to FIGS. 7A to 7E.

The light-emitting element exemplified in this embodiment includes a first electrode, a second electrode, and a layer including an organic compound having a light-emitting property (hereinafter referred to as EL layer) provided between the first and second electrodes. One of the first electrode and the second electrode functions as an anode, and the other functions as a cathode. The EL layer is provided between the first electrode and the second electrode, and the structure of the EL layer may be appropriately selected in accordance with materials of the first electrode and the second electrode. An example of the structure of the light-emitting element is described below; however, it is needless to say that the structure of the light-emitting element is not limited to the example.

Structure Example 1 of Light-Emitting Element

Figure 7A:
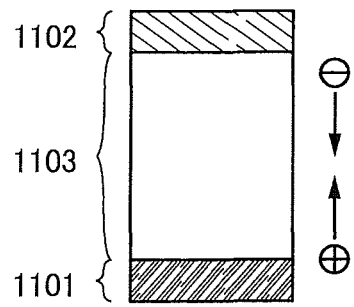
FIGS. 7A to 7E each illustrate a structure of a light-emitting element according to one embodiment of the present invention.

An example of the structure of the light-emitting element is illustrated in FIG. 7A. In the light-emitting element illustrated in FIG. 7A, an EL layer is provided between an anode 1101 and a cathode 1102.

When a voltage higher than the threshold voltage of the light-emitting element is applied between the anode 1101 and the cathode 1102, holes are injected into the EL layer from the anode 1101 side and electrons are injected into the EL layer from the cathode 1102 side. The injected electrons and holes recombine in the EL layer, so that a light-emitting substance contained in the EL layer emits light.

In this specification, a layer or a stacked body which includes one region where electrons and holes injected from both ends recombine is referred to as light-emitting unit. Therefore, it can be said that Structure example 1 of the light-emitting element includes one light-emitting unit.

A light-emitting unit 1103 may include at least one light-emitting layer including a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (a substance which blocks holes), a substance having a high electron-transport property, a substance having a high electron-injection property, and a substance having a bipolar property (a substance having high electron- and hole-transport properties).

Figure 7B:
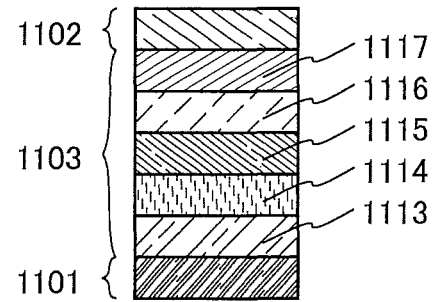

An example of a specific structure of the light-emitting unit 1103 is illustrated in FIG. 7B. In the light-emitting unit 1103 illustrated in FIG. 7B, a hole-injection layer 1113, a hole-transport layer 1114, a light-emitting layer 1115, an electron-transport layer 1116, and an electron-injection layer 1117 are stacked in that order from the anode 1101 side.

Structure Example 2 of Light-Emitting Element

Figure 7C:
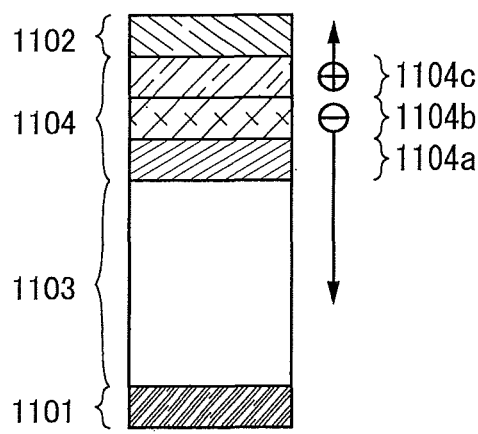

Another example of the structure of the light-emitting element is illustrated in FIG. 7C. In the light-emitting element illustrated in FIG. 7C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in Structure example 1 of the light-emitting element, which is described above, can be applied to the light-emitting unit 1103 in Structure example 2 of the light-emitting element and that the description of Structure example 1 of the light-emitting element can be referred to for the details.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The behaviors of electrons and holes in the intermediate layer 1104 are described. When a voltage higher than the threshold voltage of the light-emitting element is applied between the anode 1101 and the cathode 1102, in the first charge generation region 1104c, holes and electrons are generated, and the holes are transferred to the cathode 1102 and the electrons are transferred to the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which, for example, a substance included in the first charge generation region 1104c and a substance included in the electron-injection buffer 1104a react with each other at the interface thereof to impair the functions of the first charge generation region 1104c and the electron-injection buffer 1104a.

The range of choices of materials that can be used for the cathode in Structure example 2 of the light-emitting element is wider than that of materials that can be used for the cathode in Structure example 1. This is because the cathode in Structure example 2 may receive holes generated by the intermediate layer and a material having a relatively high work function can be used.

Structure Example 3 of Light-Emitting Element

Figure 7D:
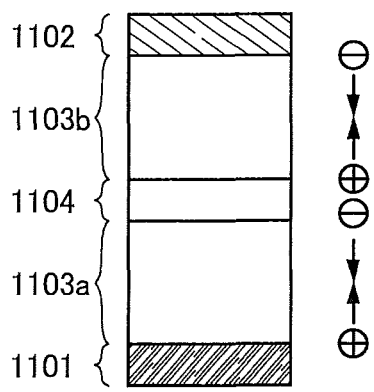
Figure 7E:
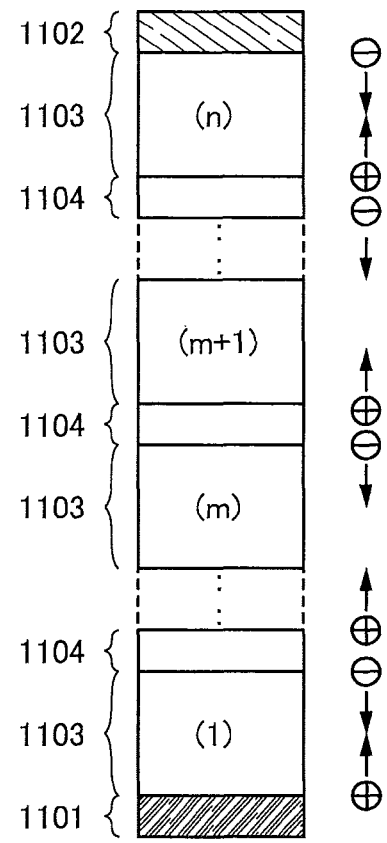

Another example of the structure of the light-emitting element is illustrated in FIG. 7D. In the light-emitting element illustrated in FIG. 7D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 7E has a structure in which a plurality of light-emitting units 1103 is stacked, that is, a so-called tandem structure. Note that in the case where n (n is a natural number greater than or equal to 2) light-emitting units 1103 are provided between the anode and the cathode, for example, the intermediate layer 1104 is provided between an m-th (in is a natural number greater than or equal to 1 and less than or equal to n−1) light-emitting unit and an (m+1)-th light-emitting unit.

Note that a structure similar to that in Structure example 1 of the light-emitting element can be applied to the light-emitting unit 1103 in Structure example 3 of the light-emitting element; a structure similar to that in Structure example 2 of the light-emitting element can be applied to the intermediate layer 1104 in Structure example 3 of the light-emitting element. Thus, for the details, the description of the Structure example 1 of the light-emitting element or the Structure example 2 of the light-emitting element can be referred to.

The behavior of electrons and holes in the intermediate layer 1104 provided between the light-emitting units is described. When a voltage higher than the threshold voltage of the light-emitting element is applied between the anode 1101 and the cathode 1102, holes and electrons are generated in the intermediate layer 1104, and the holes are transferred to the light-emitting unit provided on the cathode 1102 side and the electrons are transferred to the light-emitting unit provided on the anode side. The holes injected into the light-emitting unit provided on the cathode side recombine with the electrons injected from the cathode side, so that a light-emitting substance contained in the light-emitting unit emits light. The electrons injected into the light-emitting unit provided on the anode side recombine with the holes injected from the anode side, so that a light-emitting substance contained in the light-emitting unit emits light. Thus, the holes and electrons generated in the intermediate layer 1104 cause light emission in the respective light-emitting units.

Note that in the case where a structure which is the same as the intermediate layer is formed between the light-emitting units by providing the light-emitting units in contact with each other, the light-emitting units can be formed to be in contact with each other. Specifically, when one surface of the light-emitting unit is provided with a charge generation region, the charge generation region functions as a first charge generation region of the intermediate layer; thus, the light-emitting units can be provided in contact with each other.

The Structure examples 1 to 3 of the light-emitting element can be implemented in combination. For example, an intermediate layer can be provided between the cathode and a light-emitting unit in Structure example 3 of the light-emitting element.

Materials which can be Used for Light-Emitting Element

Next, specific materials that can be used for the light-emitting element having the above-described structure are described. Materials for the anode, the cathode, and the EL layer are described in that order.

Materials which can be Used for Anode

The anode 1101 is preferably formed using a metal, an alloy, an electrically conductive compound, a mixture of these materials, or the like which has a high work function (specifically, a work function higher than or equal to 4.0 eV is preferable). Specific examples are indium tin oxide (ITO), indium tin oxide containing silicon or silicon oxide, indium zinc oxide (IZO), indium oxide containing tungsten oxide and zinc oxide, and the like.

Such electrically conductive metal oxide films are usually formed by a sputtering method, but may also be formed by application of a sol-gel method or the like. For example, an indium-zinc oxide film can be formed by a sputtering method using a target in which zinc oxide is added at greater than or equal to 1 wt % and less than or equal to 20 wt % to indium oxide. A film of indium oxide containing tungsten oxide and zinc oxide can be formed by a sputtering method using a target in which tungsten oxide and zinc oxide are added at greater than or equal to 0.5 wt % and less than or equal to 5 wt % and greater than or equal to 0.1 wt % and less than or equal to 1 wt %, respectively, to indium oxide.

Besides, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, an electrically conductive polymer such as poly(3,4-ethylenedioxythiophene)/poly(styrenesulfonic acid) (PEDOT/PSS) or polyaniline/poly(styrenesulfonic acid) (PAni/PSS) may be used.

Note that in the case where a second charge generation region is provided in contact with the anode 1101, a variety of electrically conductive materials can be used for the anode 1101 regardless of their work functions. Specifically, besides a material which has a high work function, a material which has a low work function can also be used. A material for forming the second charge generation region is described later together with a material for forming the first charge generation region.

Materials which can be Used for Cathode

In the case where the first charge generation region 1104c is provided between the cathode 1102 and the light-emitting unit 1103 to be in contact with the cathode 1102, a variety of electrically conductive materials can be used for the cathode 1102 regardless of their work functions.

Note that at least one of the cathode 1102 and the anode 1101 is formed using an electrically conductive film that transmits visible light. For an electrically conductive film that transmits visible light, for example, indium oxide containing tungsten oxide, indium zinc oxide containing tungsten oxide, indium oxide containing titanium oxide, indium tin oxide containing titanium oxide, indium tin oxide (abbreviation: ITO), indium zinc oxide, and indium tin oxide to which silicon oxide is added can be given. Further, a metal thin film having a thickness enough to transmit light (preferably, approximately greater than or equal to 5 nm and less than or equal to 30 nm) can also be used.

Materials which can be Used for EL Layer

Specific examples of materials for the above-described layers included in the light-emitting unit 1103 are given below.

The hole-injection layer is a layer containing a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: H$_2$Pc) or copper phthalocyanine (abbreviation: CuPc), a high molecule such as poly(3,4-ethylenedioxythiophene)/poly(styrenesulfonic acid) (PEDOT/PSS), or the like to form the hole-injection layer.

Note that the hole-injection layer may be formed using the second charge generation region. When the second charge generation region is used for the hole-injection layer, a variety of electrically conductive materials can be used for the anode 1101 regardless of their work functions as described above. A material for forming the second charge generation region is described later together with a material for forming the first charge generation region.

Hole-Transport Layer

The hole-transport layer is a layer containing a substance having a high hole-transport property. The hole-transport layer is not limited to a single layer, and may be a stack of two or more layers each containing a substance having a high hole-transport property. The hole-transport layer contains a substance having a higher hole-transport property than an electron-transport property, and preferably contains a substance having a hole mobility higher than or equal to $10^{-6}$ cm$^2$/V·s because the driving voltage of the light-emitting element can be reduced.

Examples of the substance having a high hole-transport property are an aromatic amine compound such as 4,4'-bis[N-(1-naphthyl)-N-phenylamino]biphenyl (abbreviation: NPB or a-NPD), and a carbazole derivative such as 3-[N-(9-phenylcarbazol-3-yl)-N-phenylamino]-9-phenylcarbazole (abbreviation: PCzPCA1).

In addition to the above substances, a high molecular compound such as poly(N-vinylcarbazole) (abbreviation: PVK) can be used for the hole-transport layer.

Light-Emitting Layer

The light-emitting layer contains a light-emitting substance. The light-emitting layer is not limited to a single layer, and may be a stack of two or more layers containing light-emitting substances. As the light-emitting substance, a fluorescent compound or a phosphorescent compound can be used. A phosphorescent compound is preferably used as the light-emitting substance because the emission efficiency of the light-emitting element can be increased.

Examples of a fluorescent compound that can be used as the light-emitting substance are N,N'-bis[4-(9H-carbazol-9-yl)phenyl]-N,N'-diphenylstilbene-4,4'-diamine (abbreviation: YGA2S) and the like.

Examples of the phosphorescent compound that can be used as the light-emitting substance are bis[2-(4',6'-difluorophenyl)pyridinato-N,C²'iridium(III) tetrakis(1-pyrazolyl)borate (abbreviation: FIr6) and the like.

The light-emitting substance is preferably dispersed in a host material. A host material preferably has higher excitation energy than the light-emitting substance.

As a material which can be used as the host material, it is possible to use an aromatic amine compound such as NPB, or a carbazole derivative such as CzPCA1. Alternatively, it is possible to use a substance which has a high hole-transport property and contains a high molecular compound, such as PVK, PVTPA, PTPDMA, or Poly-TPD. Alternatively, it is possible to use a metal complex having a quinoline skeleton or a benzoquinoline skeleton, such as tris(8-quinolinolato) aluminum (abbreviation: Alq). Alternatively, it is possible to use a metal complex having an oxazole-based or thiazole-based ligand, such as bis[2-(2-hydroxyphenyl)benzoxazolato]zinc (abbreviation: $Zn(BOX)_2$). Further alternatively, it is possible to use a substance having a high electron-transport property, such as 2-(4-biphenylyl)-5-(4-tert-butyl-phenyl)-1,3,4-oxadiazole (abbreviation: PBD), Electron-Transport Layer The electron-transport layer is a layer that contains a substance having a high electron-transport property. The electron-transport layer is not limited to a single layer, and may be a stack of two or more layers each containing a substance having a high electron-transport property. The electron-transport layer contains a substance having a higher electron-transport property than a hole-transport property, and preferably contains a substance having an electron mobility higher than or equal to $10^{-6}$ cm²/V·s because the driving voltage of the light-emitting element can be reduced.

As the substance having a high electron-transport property, for example, a metal complex having a quinoline skeleton or a benzoquinoline skeleton, such as Alq, or the like can be used. Alternatively, a metal complex having an oxazole-based or thiazole-based ligand, such as $Zn(BOX)_2$ or $Zn(BTZ)_2$, or the like can be used. Further alternatively, PBD or the like can be used.

Besides the above-described substances, a high molecular compound such as poly[(9,9-dihexylfluorene-2,7-diyl)-co-(pyridine-3,5-diyl)] (abbreviation: PF-Py) can be used for the electron-transport layer.

Electron-Injection Layer

The electron-injection layer is a layer that contains a substance having a high electron-injection property. The electron-injection layer is not limited to a single layer, and may be a stack of two or more layers containing substances having a high electron-injection property. The electron-injection layer is preferably provided because the efficiency of electron injection from the cathode 1102 can be increased and the driving voltage of the light-emitting element can be reduced.

Examples of the substance having a high electron-injection property are alkali metals such as lithium (Li), alkaline earth metals, and compounds thereof. Alternatively, a layer in which an alkali metal, an alkaline earth metal, magnesium (Mg), or a compound of them is contained in a substance having an electron-transport property, such as a layer in which magnesium (Mg)) is contained in Alq, can be used.

Materials which can be Used for Charge Generation Region

The first charge generation region 1104c and the second charge generation region are regions containing a substance having a high hole-transport property and an acceptor substance. The charge generation region may not only include a substance having a high hole-transport property and an acceptor substance in the same film but may include a stack of a layer containing a substance having a high hole-transport property and a layer containing an acceptor substance. Note that in the case where the first charge generation region provided on the cathode side has a layered structure, the layer containing the substance having a high hole-transport property is in contact with the cathode 1102. In the case where the second charge generation region provided on the anode side has a layered structure, the layer containing the acceptor substance is in contact with the anode 1101.

Note that the acceptor substance is preferably added to the charge generation region so that the mass ratio of the acceptor substance to the substance having a high hole-transport property is greater than or equal to 0.1 and less than or equal to 4.0.

Examples of the acceptor substance that is used for the charge generation region are a transition metal oxide and an oxide of a metal belonging to Group 4 to Group 8 of the periodic table. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (e.g., an oligomer, a dendrimer, or a polymer) can be used. Specifically, a substance having a hole mobility higher than or equal to $10^{-6}$ cm²/Vs is preferably used. Note that other than the above substances, any substance that has a property of transporting more holes than electrons may be used.

Materials which can be Used for Electron-Relay Layer

The electron-relay layer 1104b is a layer that can immediately receive electrons drawn out by the acceptor substance in the first charge generation region 1104c. Therefore, the electron-relay layer 1104b is a layer containing a substance having a high electron-transport property. Its LUMO level is positioned between the acceptor level of the acceptor substance in the first charge generation region 1104c and the LUMO level of the light-emitting unit 1103 in contact with the electron-relay layer. Specifically, the LUMO level of the electron-relay layer 1104b is preferably higher than or equal to −5.0 eV and lower than or equal to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used because such a compound further facilitates acceptance of electrons in the electron-relay layer 1104b.

Specific examples of the perylene derivative are 3,4,9,10-perylenetetracarboxylic dianhydride (abbreviation: PTCDA) and the like.

Specific examples of the nitrogen-containing condensed aromatic compound are pirazino[2,3-f][1,10]phenanthroline-2,3-dicarbonitrile (abbreviation: PPDN) and the like.

Materials which can be Used Electron-Injection Buffer

The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

A substance having a high electron-injection property can be used for the electron-injection buffer 1104a. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

Further, in the case where the electron-injection buffer 1104a contains a substance having a high electron-transport property and a donor substance, the donor substance is preferably added so that the mass ratio of the donor substance to the substance having a high electron-transport property is greater than or equal to 0.001 and less than or equal to 0.1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide of lithium oxide or the like, a halide, and a carbonate such as lithium carbonate or cesium carbonate), an alkaline earth metal compound (including an oxide, a halide, and a carbonate), and a rare earth metal compound (including an oxide, a halide, and a carbonate). Note that as the substance having a high electron-transport property, a material similar to the above material for the electron-transport layer which can be formed in part of the light-emitting unit 1103 can be used.

Method of Manufacturing Light-Emitting Element

One mode of a method of manufacturing a light-emitting element is described. Over the first electrode, the layers described above are combined as appropriate to form an EL layer. Any of a variety of methods (e.g., a dry process or a wet process) can be used to form the EL layer depending on the material for the EL layer. For example, a vacuum evaporation method, an inkjet method, a spin coating method, or the like may be selected. Note that a different formation method may be employed for each layer. The second electrode is formed over the EL layer. In the above manner, the light-emitting element is manufactured.

The light-emitting element described in this embodiment can be manufactured by combination of the above-described materials. With this light-emitting element, light emission from the above-described light-emitting substance can be obtained. The emission color can be selected by changing the type of the light-emitting substance.

Further, a plurality of light-emitting substances which emit light of different colors can be used, whereby, for example, white light emission can also be obtained by expanding the width of the emission spectrum. Note that in order to obtain white light emission, for example, a structure may be employed in which at least two layers containing light-emitting substances are provided so that light of complementary colors is emitted. Specific examples of complementary colors are "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

Note that this embodiment can be combined with any of the other embodiments in this specification as appropriate.

(Embodiment 7)

In this embodiment, the structure of a transistor that can be used in a light-emitting device of one embodiment of the present invention is described. Note that a method of forming a transistor illustrated in this embodiment is described in Embodiment 8.

Figure 8A:
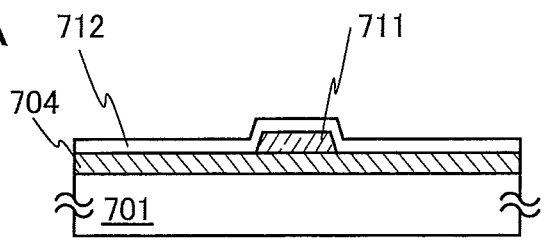
FIGS. 8A to 8D illustrate a structure and a manufacturing method of a transistor one embodiment.
Figure 8B:
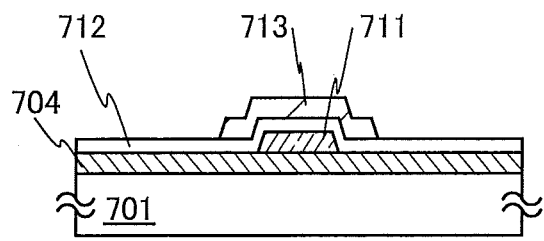
Figure 8C:
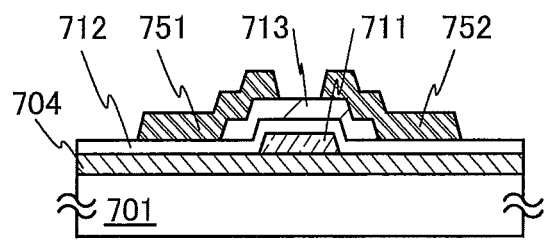
Figure 8D:
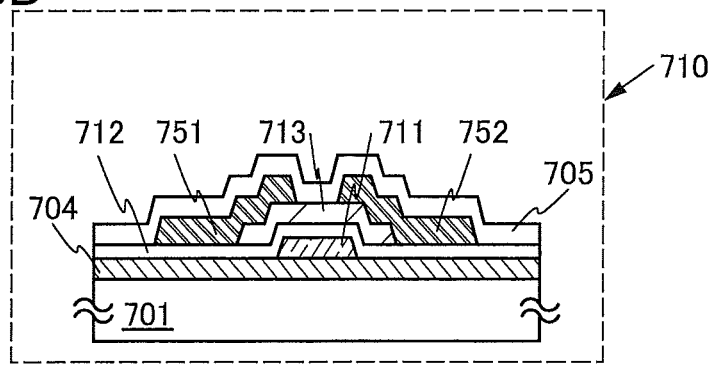

The structure of the transistor illustrated in this embodiment is described with reference to FIG. 8D. FIG. 8D illustrates a cross section of the transistor.

A transistor 710 illustrated in this embodiment includes, over a substrate 701, an insulating layer 704 serving as a base, a gate electrode 711, a gate insulating layer 712, an oxide semiconductor layer 713, electrodes 751 and 752 functioning as a source and drain electrodes, and an insulating layer 705 for protecting the transistor.

Structure of Insulating Layer Serving as Base

The insulating layer 704 serves as a base of the transistor 710.

The insulating layer 704 serving as a base may have either a single-layer structure of a layer including one or more materials selected from silicon oxide, silicon nitride, silicon oxynitride, silicon nitride oxide, aluminum oxide, aluminum nitride, aluminum oxynitride, aluminum nitride oxide, hafnium oxide, gallium oxide, and the like or a layered structure of two or more layers including one or more such materials, for example.

Gate Electrode

The gate electrode 711 overlaps with the oxide semiconductor layer 713 with the gate insulating layer 712 provided therebetween, and functions as a gate electrode of the transistor 710.

The gate electrode 711 may have either a single-layer structure of a layer containing an electrically conductive material or a layered structure of two or more layers each containing an electrically conductive material.

As the electrically conductive material, any electrically conductive material may be used as long as it has electrical conductivity and can withstand the heat treatment process. For example, a metal selected from molybdenum, titanium, tantalum, tungsten, aluminum, copper, neodymium, scandium, and the like, or an alloy containing the metal can be used.

Alternatively, a semiconductor layer typified by a polycrystalline silicon film doped with an impurity element such as phosphorus, or a silicide layer such as a nickel silicide layer may be used.

Gate Insulating Layer

The gate insulating layer 712 can be formed using silicon oxide, silicon nitride, silicon oxynitride, silicon nitride oxide, gallium oxide, aluminum oxide, aluminum oxynitride, tantalum oxide, or the like.

The gate insulating layer 712 can be formed using a high dielectric constant (high-k) material. Examples of a high dielectric constant material are hafnium oxide, yttrium oxide, lanthanum oxide, hafnium silicate ($HfSi_xO_y$ (x>0, y>0)), hafnium aluminate ($HfAl_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), and the like.

The gate insulating layer 712 may have either a single-layer structure or a layered structure. For example, the gate insulating layer 712 may have a layered structure of a layer containing a high-k material and a layer containing a material selected from silicon oxide, silicon nitride, silicon oxynitride, silicon nitride oxide, aluminum oxide, or the like.

When the gate insulating layer 712 is made thin or formed using the high-k material, the transistor can be reduced in size without sacrificing operating characteristics.

For example, in the case where silicon oxide is used, the thickness can be set to greater than or equal to 1 nm and less than or equal to 100 nm, preferably greater than or equal to 10 nm and less than or equal to 50 nm.

In the case where a high-k material is used, the transistor can be reduced in size without making the transistor so thin that gate leakage due to a tunneling effect or the like is generated.

Note that the gate insulating layer 712 can be formed using an insulating material containing a Group 13 element and oxygen. Note that an insulating material containing a Group 13 element means an insulating material containing one or more Group 13 elements.

Examples of the insulating material containing a Group 13 element and oxygen are gallium oxide, aluminum oxide, aluminum gallium oxide, and gallium aluminum oxide. Here, aluminum gallium oxide refers to a substance in which the aluminum content is higher than the gallium content in atomic percent (at. %), and gallium aluminum oxide refers to a substance in which the gallium content is higher than or equal to the aluminum content in atomic percent (at. %).

Oxide Semiconductor Layer

The oxide semiconductor layer 713 in which a channel is formed overlaps with the gate electrode 711 with the gate insulating layer 712 interposed therebetween and is electrically connected to the electrodes 751 and 752 between which the gate electrode 711 is provided. Note that the electrodes 751 and 752 function as a source and drain electrodes.

The thickness of the oxide semiconductor layer 713 in which a channel is formed is greater than or equal to 2 nm and less than or equal to 200 nm, preferably greater than or equal to 5 nm and less than or equal to 30 nm.

Note that the oxide semiconductor layer 713 is not necessarily processed into an island shape.

The oxide semiconductor layer 713 may be either single crystal or non-single-crystal. In the latter case, the oxide semiconductor layer 713 may have an amorphous structure, a crystalline portion, or a crystalline portion in an amorphous structure. The oxide semiconductor layer 713 may be amorphous, polycrystalline, or non-amorphous.

An example of a crystalline oxide semiconductor layer is an oxide semiconductor layer having c-axis aligned crystals (CAAC).

The proportion of oxygen in the oxide semiconductor layer 713 is preferably higher than the stoichiometric proportion. When the proportion of oxygen is higher than the stoichiometric proportion, generation of carriers caused by oxygen vacancies in a metal oxide layer can be inhibited.

The oxide semiconductor layer 713 preferably contains at least indium (In) or zinc (Zn). In particular, the oxide semiconductor layer 713 preferably contains In and Zn.

As a stabilizer for reducing variation in electric characteristics of transistors using an oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, an In—Ga—Zn—O-based material means an oxide containing indium (In), gallium (Ga), and zinc (Zn). There is no particular limitation on the composition ratio. Further, the In—Ga—Zn—O-based material may contain a metal element other than In, Ga, and Zn. For example, the In—Ga—Zn—O-based material may contain $SiO_2$.

A material represented by $InMO_3(ZnO)_m$ (m>0, where m is not an integer) may be used as the oxide semiconductor. Note that M denotes one or more metal elements selected from Ga, Fe, Mn, and Co. A material represented by $In_2SnO_5(ZnO)_n$ (n>0, where n is an integer) may be used as the oxide semiconductor.

However, without limitation to the materials given above, a material with an appropriate composition may be used depending on needed semiconductor characteristics (e.g., mobility, threshold voltage, and variation). In order to obtain needed semiconductor characteristics, it is preferable that carrier concentration, impurity concentration, defect density, an atomic ratio between a metal element and oxygen, interatomic distance, density, and the like be set to appropriate values.

Source Electrode and Drain Electrode

The electrodes 751 and 752 are electrically connected to the oxide semiconductor layer 713, and function as a source and drain electrodes of the transistor.

The electrode functioning as the source electrode or the drain electrode may have either a single-layer structure of a layer containing an electrically conductive material or a layered structure of two or more layers each containing an electrically conductive material.

Any electrically conductive material may be used as long as it can withstand heat treatment. For example, a metal selected from aluminum, chromium, copper, titanium, tantalum, molybdenum, and tungsten, or an alloy containing the metal can be used. Alternatively, a metal selected from manganese, magnesium, zirconium, beryllium, neodymium, and scandium, or an alloy containing the metal can be used.

A metal nitride can be used as the electrically conductive material. Specific examples of the metal nitride are titanium nitride, molybdenum nitride, and tungsten nitride.

Alternatively, an electrically conductive metal oxide can be used as the electrically conductive material. Specifically, indium oxide, tin oxide, indium tin oxide (also referred to as ITO) (indium oxide-tin oxide), indium zinc oxide (indium oxide-zinc oxide), zinc oxide, zinc oxide to which gallium or aluminum is added, or the metal oxide material which contains silicon oxide can be used.

Alternatively, graphene or the like can be used as the electrically conductive material It is possible to employ, for example, a single-layer structure of a titanium layer or a titanium nitride layer, a single-layer structure of an aluminum layer containing silicon, a two-layer structure in which a titanium layer is stacked over an aluminum layer, a two-layer structure in which a titanium layer is stacked over a titanium nitride layer, a three-layer structure in which a titanium layer, an aluminum layer, and a titanium layer are stacked, or the like.

Note that the channel length L of the transistor depends on a distance between an edge of the source electrode which is in contact with the oxide semiconductor layer and an edge of the drain electrode which is in contact with the oxide semiconductor layer.

Insulating Layer for Protecting Transistor

The insulating layer 705 prevents entry of an impurity such as moisture from the outside to protect the transistor.

The thickness of the insulating layer 705 is at least 1 nm or more.

The insulating layer 705 may have either a single-layer structure of a layer including an insulator having a barrier property or a layered structure of two or more layers each including an insulator having a barrier property.

In particular, a structure in which aluminum oxide is contained is preferred. A layered structure of an aluminum oxide layer and a layer containing another inorganic insulating material may be employed. This is because aluminum oxide does not easily transmit moisture, oxygen, and another impurity.

Alternatively, the insulating layer 705 may have a stack of an oxide insulating layer having an oxygen excess region and an aluminum oxide layer. The oxide insulating layer having an oxygen excess region may be provided closer than the aluminum oxide layer to the oxide semiconductor layer.

For example, a silicon oxide film, a silicon oxynitride film, or the like can be used for the oxide insulating layer having an oxygen excess region.

This embodiment can be implemented in combination with any of the other embodiments in this specification as appropriate.

(Embodiment 8)

In this embodiment, a method of manufacturing the transistor 710 including an oxide semiconductor layer in a channel formation region, which is described in Embodiment 7, is described with reference to FIGS. 8A to 8D.

Formation of Insulating Layer Serving as Base

First, the insulating layer 704 serving as a base of the transistor 710 is formed. The insulating layer 704 serving as a base is formed over the substrate 701 by a plasma CVD method, a sputtering method, or the like.

The substrate 701 has heat resistance high enough to withstand treatment performed after the formation of the insulating layer serving as a base, and is not limited in size.

The substrate 701 may be provided with another semiconductor element in advance.

As the substrate 701, it is possible to use, for example, a glass substrate such as a barium borosilicate glass substrate or an aluminoborosilicate glass substrate, a ceramic substrate, a quartz substrate, a sapphire substrate, or the like. Alternatively, it is possible to use a single crystal semiconductor substrate or a polycrystalline semiconductor substrate made of silicon or silicon carbide, a compound semiconductor substrate made of silicon germanium or the like, an SOI substrate, or the like.

As the substrate 701, a flexible substrate may be used. A transistor may be directly formed over a flexible substrate. Alternatively, a transistor may be formed over a manufacturing substrate, and then, the transistor may be separated from the manufacturing substrate and transferred to a flexible substrate. Note that in the case where the transistor is separated from the manufacturing substrate and transferred to the flexible substrate, a separation layer is preferably provided between the manufacturing substrate and the transistor including an oxide semiconductor layer.

Formation of Gate Electrode

Then, an electrically conductive layer serving as the gate electrode is formed by a sputtering method or the like.

Next, a resist mask is formed through a photolithography process. The electrically conductive layer serving as the gate electrode is etched using the resist mask, so that the gate electrode 711 is formed.

Gate Insulating Layer

Next, the gate insulating layer 712 is formed over the gate electrode layer. An insulating layer serving as the insulating layer over the gate electrode is formed by a plasma CVD method, a sputtering method, or the like (see FIG. 8A).

Formation of Oxide Semiconductor Layer

Next, the oxide semiconductor layer 713 where a channel is to be formed is formed over the gate insulating layer 712.

The oxide semiconductor layer can be formed by a sputtering method, a molecular beam epitaxy method, an atomic layer deposition method, or a pulsed laser deposition method.

For example, in the case where an In—Ga—Zn—O-based material is used for the oxide semiconductor, the oxide semiconductor layer can be formed using a target. A variety of materials and a variety of composition ratios can be used as the material and composition ratio of the target. For example, an oxide target containing $In_2O_3$, $Ga_2O_3$, and ZnO, in which $In_2O_3$:$Ga_2O_3$:ZnO=1:1:1 (mole ratio), can be used. Alternatively, for example, an oxide target containing $In_2O_3$, $Ga_2O_3$, and ZnO, in which $In_2O_3$:$Ga_2O_3$:ZnO=1:1:2 (mole ratio), can be used.

In the case where an In—Zn—O-based material is used for the oxide semiconductor, the atomic composition ratio in the target used is In:Zn=50:1 to 1:2 ($In_2O_3$:ZnO=25:1 to 1:4 (mole ratio)), preferably, In:Zn=20:1 to 1:1 ($In_2O_3$:ZnO=10:1 to 1:2 (mole ratio)), and further preferably, In:Zn=15:1 to 1.5:1 ($In_2O_3$:ZnO=15:2 to 3:4 (mole ratio)). For example, in a target used for formation of an In—Zn—O-based oxide semiconductor, the atomic ratio of In to Zn and O is X:Y:Z, where Z>1.5X+Y.

For example, in the case where an In—Sn—Zn—O-based material is used for the oxide semiconductor, the oxide semiconductor layer can be formed using a target. A variety of composition ratios can be used as the composition ratio of the target. For example, an oxide target containing In, Sn, and Zn, in which the atomic ratio of In to Sn and Zn is 1:2:2 (=In:Sn:Zn), can be used. Alternatively, for example, an oxide target containing In, Sn, and Zn, in which the atomic ratio of In to Sn and Zn is 2:1:3 (=In:Sn:Zn), can be used. Alternatively, for example, an oxide target containing In, Sn, and Zn, in which the atomic ratio of In to Sn and Zn is 1:1:1 (=In:Sn:Zn), can be used. Alternatively, for example, an oxide target containing In, Sn, and Zn, in which the atomic ratio of In to Sn and Zn is 20:45:35 (=In:Sn:Zn), can be used.

Note that the relative density of the target is higher than or equal to 90% and lower than or equal to 100%, preferably higher than or equal to 95% and lower than or equal to 99.9%. Use of a target having high relative density makes the formed oxide semiconductor layer dense.

Then, a resist mask is formed through a photolithography process. The oxide semiconductor layer is selectively etched using the resist mask to be processed into an island shape (see FIG. 8B).

Formation of Electrode Functioning as Source Electrode or Drain Electrode

Then, the electrodes 751 and 752 functioning as a source and drain electrodes are formed.

A layer which is to be a source and drain electrodes and contains an electrically conductive material is formed by a sputtering method or the like.

Then, a resist mask is formed through a photolithography process. The layer containing an electrically conductive material is selectively etched using the resist mask, so that the electrodes 751 and 752 are formed (see FIG. 8C). Note that a wiring and the like (not illustrated) made of the layer containing an electrically conductive material are formed in the same step.

Formation of Insulating Layer for Protecting Transistor

Next, the insulating layer 705 for protecting the transistor is formed.

The insulating layer for protecting the transistor is formed by a plasma CVD method, a sputtering method, or the like.

Through the above steps, the transistor 710 which includes an oxide semiconductor material in a region where a channel is formed can be obtained.

Note that the resist mask used in this embodiment is not limited to a resist mask formed through a photolithography process. The resist mask can be formed by an inkjet method, a printing method, or the like as appropriate instead of a photolithography process. When the resist mask is formed without the use of a photomask, the manufacturing cost of a light-emitting device can be reduced.

This embodiment can be implemented in combination with any of the other embodiments in this specification as appropriate.

(Embodiment 9)

In this embodiment, a passive matrix light-emitting device of one embodiment of the present invention is described. Specifically, the passive matrix light-emitting device has a structure in which a plurality of light-emitting elements and a viscous material layer over a first substrate are sealed in a space between the first substrate and a second substrate which face each other, with a sealing material surrounding the plurality of light-emitting elements. The viscous material layer is surrounded by a frame, in contact with the light-emitting element and provided between the first and second substrates, and includes a non-solid material having viscosity and a drying agent that reacts with an impurity (typically water and/or oxygen) or adsorbs an impurity.

Passive Matrix Light-Emitting Device

Figure 9A:
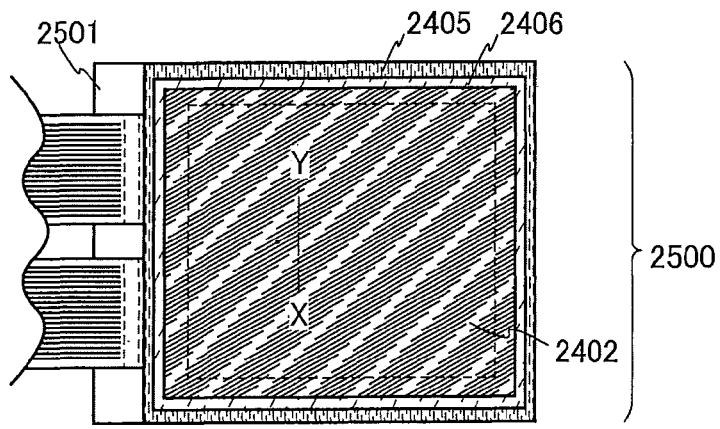
FIGS. 9A to 9C illustrate a light-emitting device according to one embodiment of the present invention.
Figure 9B:
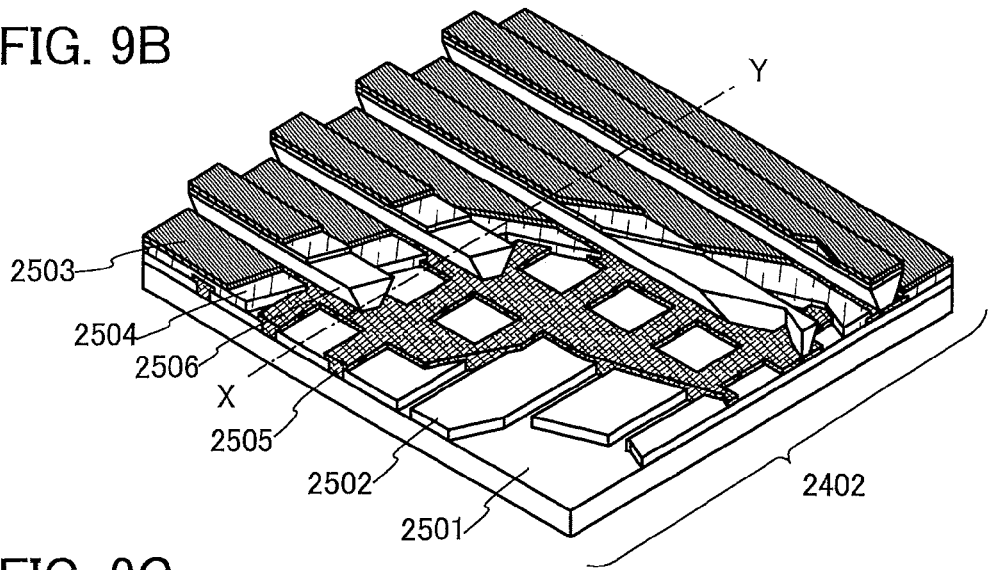
Figure 9C:
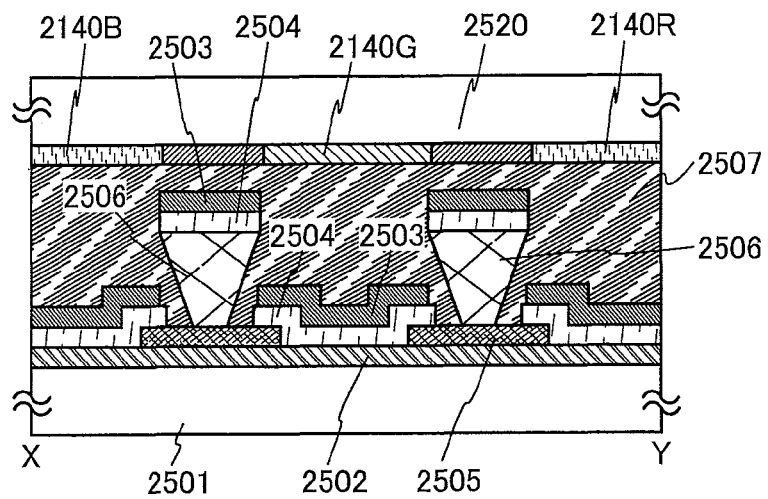

A structure in which a light-emitting element and a viscous material layer are sealed with a sealing material surrounding the light-emitting element is applied to a passive matrix light-emitting device is illustrated in FIGS. 9A and 9B. Note that FIG. 9A is a top view of the light-emitting device. FIG. 9B is a perspective view illustrating details of a pixel portion provided over the first substrate of the light-emitting device illustrated in FIG. 9A. FIG. 9C is a cross-sectional view along the line X-Y of FIG. 9A.

The passive matrix light-emitting device 2500 has a structure in which the pixel portion 2402, the viscous material layer 2507, and the frame 2406 surrounding the pixel portion 2402 are sealed in a space between the first substrate 2501 and the second substrate 2520, with the sealing material 2405 (see FIG. 9A and FIG. 9B).

The pixel portion 2402 includes light-emitting elements provided in a matrix, in each of which a layer 2504 including an organic compound having a light-emitting property is provided between a first electrode 2502 provided over the first substrate 2501 and a second electrode 2503 which crosses the first electrode 2502. As a structure of the light-emitting element, for example, the structure of the light-emitting element exemplified in Embodiment 6 can be employed. Note that an edge portion of the first electrode 2502 is covered with an insulating layer 2505 and a partition layer 2506 is provided over the insulating layer 2505.

Sidewalls of the partition layer 2506 slope so that the distance between one sidewall and the other sidewall gradually decreases toward the surface of the substrate. In other words, a cross section taken along the direction of the short side of the partition layer 2506 is trapezoidal, and the base (side parallel to the plane of the insulating layer 2505 and in contact with the insulating layer 2505) is shorter than the upper side (side parallel to the plane of the insulating layer 2505 and not in contact with the insulating layer 2505). The second electrode 2503 is divided to form a stripe pattern by the partition layer 2506 provided as described above, so that a malfunction of the light-emitting device due to crosstalk or the like can be prevented.

Further, the light-emitting elements included in the light-emitting device exemplified in this embodiment exhibit white light. The second substrate 2520 is provided with a color filter 2140R which transmits red light, a color filter 2140G which transmits green light, and a color filter 2140B which transmits blue light. The first substrate 2501 and the second substrate 2520 are bonded with the sealing material 2405 so that the color filters and the respective light-emitting elements can overlap.

Note that this embodiment can be combined with any of the other embodiments in this specification as appropriate.

(Embodiment 10)

In this embodiment, electronic devices of one embodiment of the present invention are described. Specifically, the electronic devices have a structure in which a light-emitting element formed over a first substrate and a viscous material layer are sealed in a space between the first substrate and a second substrate which face each other, with a sealing material surrounding the light-emitting element. The electronic devices each incorporating a light-emitting module including a light-emitting module, in which the viscous material layer is surrounded by a frame, in contact with the light-emitting element and provided between the first and second substrates, and includes a non-solid material having viscosity and a drying agent that can react with an impurity (typically water and/or oxygen) or adsorb an impurity, are described using FIGS. 10A to 10F.

Examples of the electronic devices to which the light-emitting device is applied are television sets (also referred to as televisions or television receivers), monitors of computers or the like, cameras such as digital cameras or digital video cameras, digital photo frames, mobile phone sets (also referred to as mobile phones or mobile phone devices), portable game machines, portable information terminals, audio playback devices, large-sized game machines such as pachinko machines, and the like. Specific examples of these electronic devices are illustrated in FIGS. 10A to 10E.

Figure 10A:
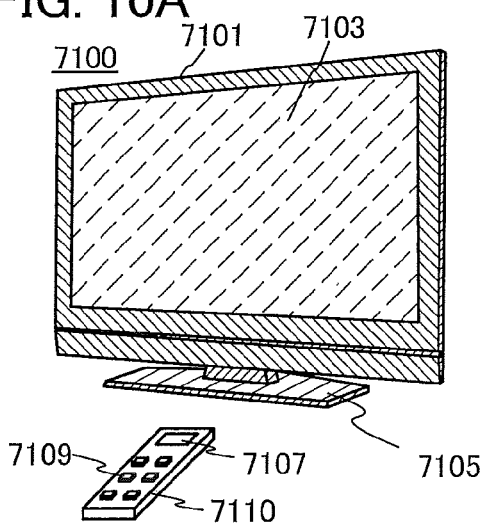
FIGS. 10A to 10F illustrate electronic devices according to one embodiment of the present invention.

FIG. 10A illustrates an example of a television set. In a television set 7100, a display portion 7103 is incorporated in a housing 7101. The display portion 7103 can display images and can use the light-emitting device. In addition, here, the housing 7101 is supported by a stand 7105.

The television set 7100 can be operated with an operation switch of the housing 7101 or a separate remote controller 7110. With operation keys 7109 of the remote controller 7110, channels and volume can be adjusted and thus images displayed on the display portion 7103 can be controlled.

Furthermore, the remote controller 7110 may be provided with a display portion 7107 for displaying data output from the remote controller 7110.

Note that the television set 7100 is provided with a receiver, a modem, and the like. With the receiver, general television broadcasts can be received. Moreover, when the display device is connected to a communication network with or without wires via the modem, one-way (from a sender to a receiver) or two-way (between a sender and a receiver or between receivers) data communication can be performed.

Figure 10B:
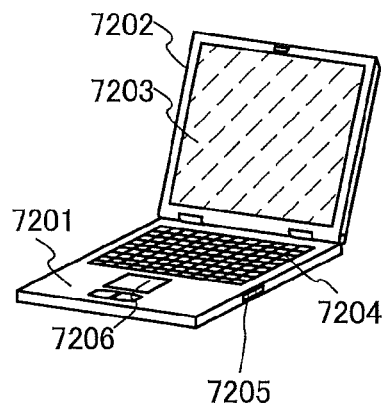

FIG. 10B illustrates a computer, which includes a main body 7201, a housing 7202, a display portion 7203, a keyboard 7204, an external connection port 7205, a pointing device 7206, and the like. This computer is manufactured by using a light-emitting device for the display portion 7203.

Figure 10C:
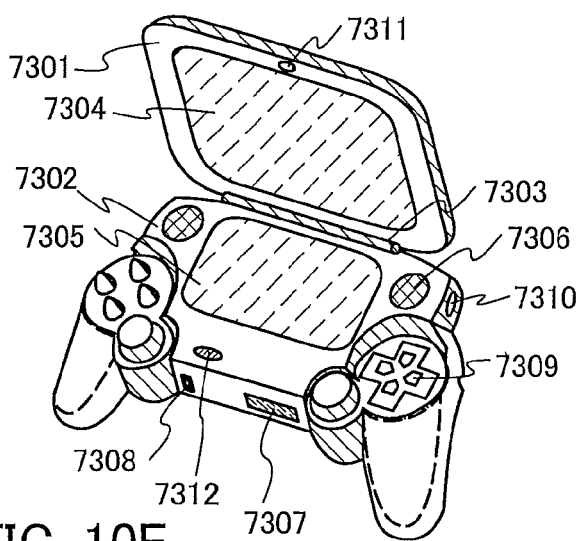

FIG. 10C illustrates a portable game machine, which includes two housings, i.e., a housing 7301 and a housing 7302, connected to each other via a joint portion 7303 so that the portable game machine can be opened or closed. A display portion 7304 is incorporated in the housing 7301 and a display portion 7305 is incorporated in the housing 7302. In addition, the portable game machine illustrated in FIG. 10C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), or a microphone 7312), and the like. It is needless to say that the structure of the portable game machine is not limited to the above as long as the light-emitting device is used for at least either the display portion 7304 or the display portion 7305, or both of them. The portable game machine may be provided with other accessories as appropriate. The portable game machine in FIG. 10C has a function of reading a program or data stored in a recording medium to display it on the display portion, and a function of sharing data with another portable game machine by wireless communication. The portable game machine in FIG. 10C can have various functions without being limited to this example.

Figure 10D:
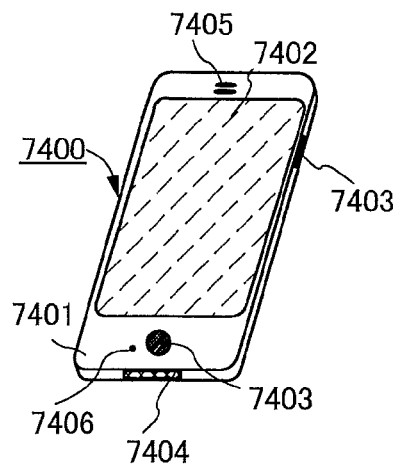

FIG. 10D illustrates an example of a mobile phone set. The mobile phone set 7400 is provided with a display portion 7402 incorporated in a housing 7401, an operation button 7403, an external connection port 7404, a speaker 7405, a microphone 7406, and the like. Note that the mobile phone set 7400 is manufactured using a light-emitting device for the display portion 7402.

When the display portion 7402 of the mobile phone set 7400 illustrated in FIG. 10D is touched with a finger or the like, data can be input to the mobile phone set 7400. Further, operations such as making a call and composing an e-mail can be performed by touching the display portion 7402 with a finger or the like.

There are mainly three screen modes for the display portion 7402. The first mode is a display mode mainly for displaying images. The second mode is an input mode mainly for inputting data such as a character. The third mode is a display-and-input mode in which two modes of the display mode and the input mode are combined.

For example, in the case of making a call or composing an e-mail, a character input mode mainly for inputting a character is selected for the display portion 7402 so that a character displayed on a screen can be input. In that case, it is preferable to display a keyboard or number buttons on almost all the area of the screen of the display portion 7402.

When a detection device including a sensor for detecting inclination, such as a gyroscope or an acceleration sensor, is provided inside the mobile phone set 7400, display on the screen of the display portion 7402 can be automatically changed by determining the orientation of the mobile phone set 7400 (whether the mobile phone set is placed horizontally or vertically for a landscape mode or a portrait mode).

The screen modes are switched by touching the display portion 7402 or operating the operation button 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled to be switched from the input mode to the display mode.

The display portion 7402 may function as an image sensor. For example, an image of a palm print, a fingerprint, or the like is taken by touching the display portion 7402 with the palm or the finger, whereby personal authentication can be performed. Further, by providing a backlight or a sensing light source which emits a near-infrared light in the display portion, an image of a finger vein, a palm vein, or the like can also be taken.

Figure 10E:
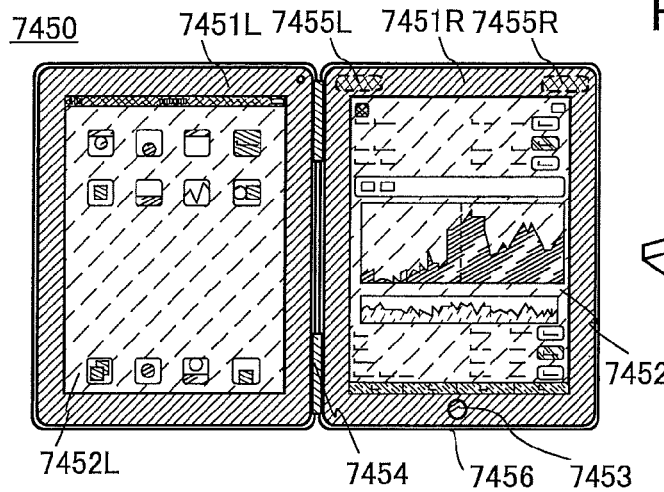

FIG. 10E illustrates an example of a folding computer. The folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. Note that when the folding computer is folded on the hinges 7454 so that the display portion 7452L provided in the housing 7451L and the display portion 7452R provided in the housing 7451R can face each other, the display, portions can be protected by the housings.

Each of the display portions 7452L and 7452R is a component which can display images and to which information can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another electronic device connected to the network from a distant place.

Figure 10F:
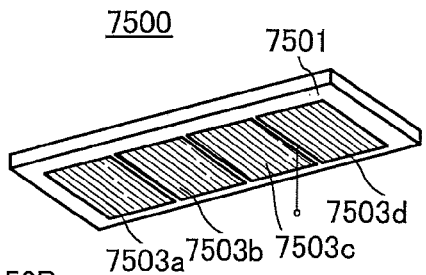

FIG. 10F illustrates an example of a lighting device. In a lighting device 7500, light-emitting devices 7503a to 7503d of one embodiment of the present invention are incorporated in a housing 7501 as light sources. The lighting device 7500 can be attached to a ceiling, a wall, or the like.

The light-emitting device of one embodiment of the present invention includes a light-emitting module in a thin film form. Thus, when the light-emitting device is attached to a base with a curved surface, a light-emitting device with a curved surface can be obtained. In addition, when the light-emitting device is located in a housing with a curved surface, an electronic device or a lighting device with a curved surface can be obtained.

Note that this embodiment can be combined with any of the other embodiments in this specification as appropriate.

This application is based on Japanese Patent Application serial no. 2011-184869 filed with the Japan Patent Office on Aug. 26, 2011, the entire contents of which are hereby incorporated by reference.

What is claimed is:

1. A light-emitting module comprising:
   a pixel portion, a driver circuit portion including a source driver circuit and a gate driver circuit over a substrate, the pixel portion including a transistor, a light-emitting element and a partition over the transistor; and
   a first frame and a second frame over the substrate,
   wherein the source driver circuit and the gate driver circuit are surrounded by the first frame and the second frame, and the pixel portion is surrounded by the second frame,
   wherein the second frame includes an opening at a position over and between the pixel portion and the driver circuit portion, and
   wherein the first frame is continuous in plan view.

2. The light-emitting module according to claim 1, further comprising sealing material in contact with an entire outer surface of the first frame.

3. The light-emitting module according to claim 2, wherein a width of the sealing material is larger than a width of the first frame.

4. The light-emitting module according to claim 1, wherein the second frame shares one side of the first frame.

5. The light-emitting module according to claim 1, further comprising a viscous material layer including a drying agent over the partition and the light-emitting element.

6. The light-emitting module according to claim 1, wherein the light-emitting module is incorporated into a display device of a television set, a computer, a portable game machine, or a mobile phone set.

7. A light-emitting module comprising:
   a pixel portion, a driver circuit portion including a source driver circuit and a gate driver circuitover a substrate, the pixel portion including a transistor, a light-emitting element and a partition over the transistor; and
   a first frame over the substrate and a second frame over the partition,
   wherein the source driver circuit and the gate driver circuit are surrounded by the first frame and the second frame, and the pixel portion is surrounded by the second frame,
   wherein the second frame includes an opening at a position over and between the pixel portion and the driver circuit portion, and
   wherein the first frame is continuous in plan view.

8. The light-emitting module according to claim 7, further comprising a sealing material in contact with an entire outer surface of the first frame.

9. The light-emitting module according to claim 8, wherein a width of the sealing material is larger than a width of the first frame.

10. The light-emitting module according to claim 7, wherein the second frame shares one side of the first frame.

11. The light-emitting module according to claim 7, further comprising a viscous material layer including a drying agent over the partition and the light-emitting element.

12. The light-emitting module according to claim 7, wherein the light-emitting module is incorporated into a display device of a television set, a computer, a portable game machine, or a mobile phone set.

13. A light-emitting module comprising:
   a pixel portion, a driver circuit portion including a source driver circuit and a gate driver circuit over a substrate, the pixel portion including a transistor, a light-emitting element and a partition over the transistor; and
   a first frame over the substrate and a second frame over the partition,
   wherein the source driver circuit and the gate driver circuit are surrounded by the first frame and the second frame, and the pixel portion is surrounded by the second frame,
   wherein the second frame includes an opening at a position over and between the pixel portion and the source driver circuit, and
   wherein the first frame is continuous in plan view.

14. The light-emitting module according to claim 13, further comprising a sealing material in contact with an entire outer surface of the first frame.

15. The light-emitting module according to claim 14, wherein a width of the sealing material is larger than a width of the first frame.

16. The light-emitting module according to claim 13, wherein the second frame shares one side of the first frame.

17. The light-emitting module according to claim 13, further comprising a viscous material layer including a drying agent over the partition and the light-emitting element.

18. The light-emitting module according to claim 13, wherein the light-emitting module is incorporated into a display device of a television set, a computer, a portable game machine, or a mobile phone set.

* * * * *